(12) United States Patent
Jang et al.

(10) Patent No.: US 10,879,292 B2
(45) Date of Patent: Dec. 29, 2020

(54) SEMICONDUCTOR PACKAGE AND METHOD OF MANUFACTURING THE SAME

(71) Applicants: Jaegwon Jang, Hwaseong-si (KR); Seokhyun Lee, Hwaseong-si (KR); Kyoung Lim Suk, Suwon-si (KR)

(72) Inventors: Jaegwon Jang, Hwaseong-si (KR); Seokhyun Lee, Hwaseong-si (KR); Kyoung Lim Suk, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/364,237

(22) Filed: Mar. 26, 2019

(65) Prior Publication Data
US 2020/0091215 A1 Mar. 19, 2020

(30) Foreign Application Priority Data
Sep. 14, 2018 (KR) .......................... 10-2018-0110044

(51) Int. Cl.
*H01L 27/00* (2006.01)
*H01L 27/146* (2006.01)

(52) U.S. Cl.
CPC .. *H01L 27/14634* (2013.01); *H01L 27/14636* (2013.01); *H01L 27/1464* (2013.01)

(58) Field of Classification Search
CPC .................................. H01L 24/13; H01L 24/16
See application file for complete search history.

(56) References Cited

U.S. PATENT DOCUMENTS

| | | | |
|---|---|---|---|
| 7,282,444 B2 | 10/2007 | Tanida et al. |
| 9,601,463 B2 | 3/2017 | Yu et al. |
| 9,620,465 B1 | 4/2017 | Pan et al. |
| 9,633,974 B2 | 4/2017 | Zhai et al. |
| 9,659,907 B2 | 5/2017 | Zhai et al. |
| 9,735,131 B2 | 8/2017 | Su et al. |
| 9,768,133 B1 | 9/2017 | Wu et al. |
| 9,837,379 B2 | 12/2017 | Chen et al. |
| 9,899,443 B2 | 2/2018 | Lee et al. |

(Continued)

FOREIGN PATENT DOCUMENTS

| | | |
|---|---|---|
| JP | 2005167093 A | 6/2005 |
| JP | 2014096547 A | 5/2014 |

*Primary Examiner* — Caridad Everhart
*Assistant Examiner* — Ankush K Singal
(74) *Attorney, Agent, or Firm* — Volentine, Whitt & Francos, PLLC

(57) ABSTRACT

A semiconductor package includes a first redistribution layer, a first semiconductor chip on the first redistribution layer, a molding layer covering the first semiconductor chip, metal pillars around the first semiconductor chip and connected to the first redistribution layer, a second redistribution layer on the molding layer and connected to the metal pillars, and a second semiconductor chip on the second redistribution layer. The metal pillars extend through the molding layer. When viewed in plan, the second semiconductor chip overlaps the first semiconductor chip and the metal pillars. A method of manufacturing the semiconductor package obtains a wafer map from a first substrate that includes a plurality of first semiconductor chips and uses the wafer map in selectively stacking second semiconductor chips on the first semiconductor chips.

20 Claims, 31 Drawing Sheets

(56) References Cited

U.S. PATENT DOCUMENTS

| | | | |
|---|---|---|---|
| 2013/0277840 A1* | 10/2013 | Yu | H01L 23/3675 |
| | | | 257/738 |
| 2016/0276307 A1* | 9/2016 | Lin | H01L 23/552 |
| 2016/0365334 A1* | 12/2016 | Shih | H01L 25/105 |
| 2017/0033080 A1 | 2/2017 | Chen et al. | |
| 2017/0133288 A1* | 5/2017 | Baek | H01L 23/5226 |
| 2017/0294469 A1 | 10/2017 | Lee et al. | |
| 2018/0005984 A1 | 1/2018 | Yu et al. | |
| 2018/0033770 A1* | 2/2018 | Hsu | H01L 25/105 |
| 2018/0068978 A1* | 3/2018 | Jeng | H01L 24/19 |
| 2018/0076166 A1* | 3/2018 | Yu | H01L 23/3107 |
| 2018/0076179 A1 | 3/2018 | Hsu et al. | |
| 2018/0130761 A1* | 5/2018 | Kim | H01L 23/5389 |
| 2018/0145104 A1* | 5/2018 | Kim | H01L 27/14634 |
| 2019/0131252 A1* | 5/2019 | Kim | H01L 23/3128 |
| 2019/0287924 A1* | 9/2019 | Moon | H01L 23/552 |

* cited by examiner

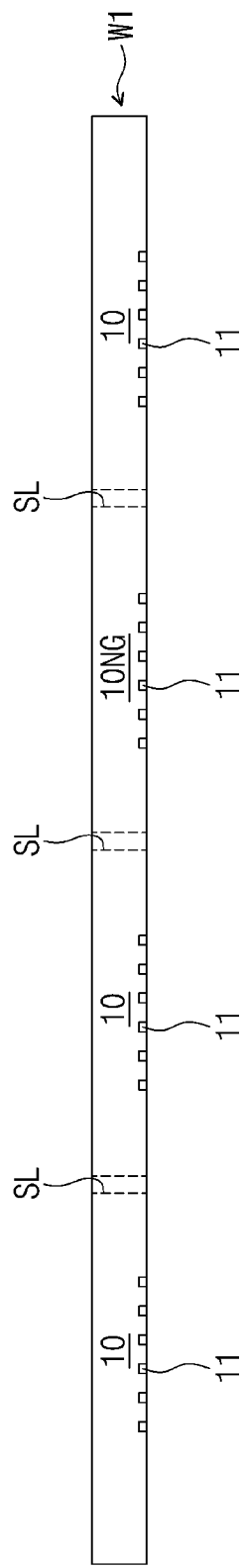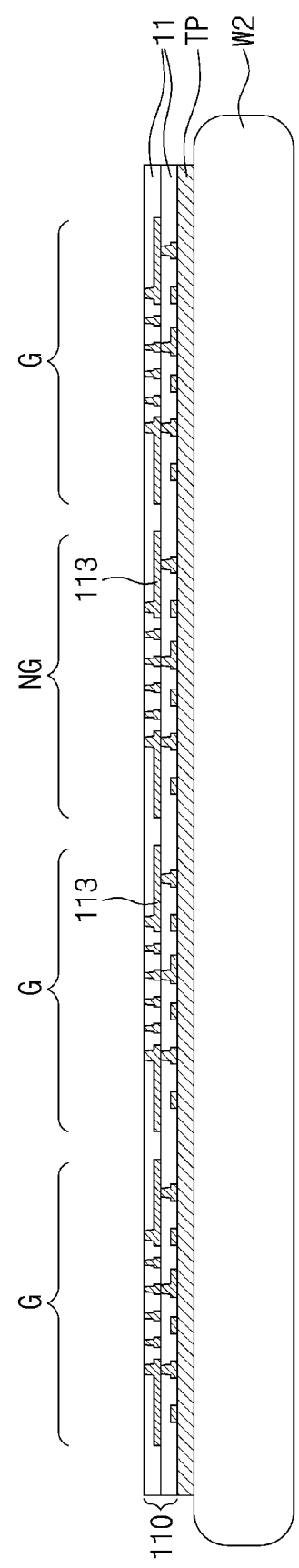

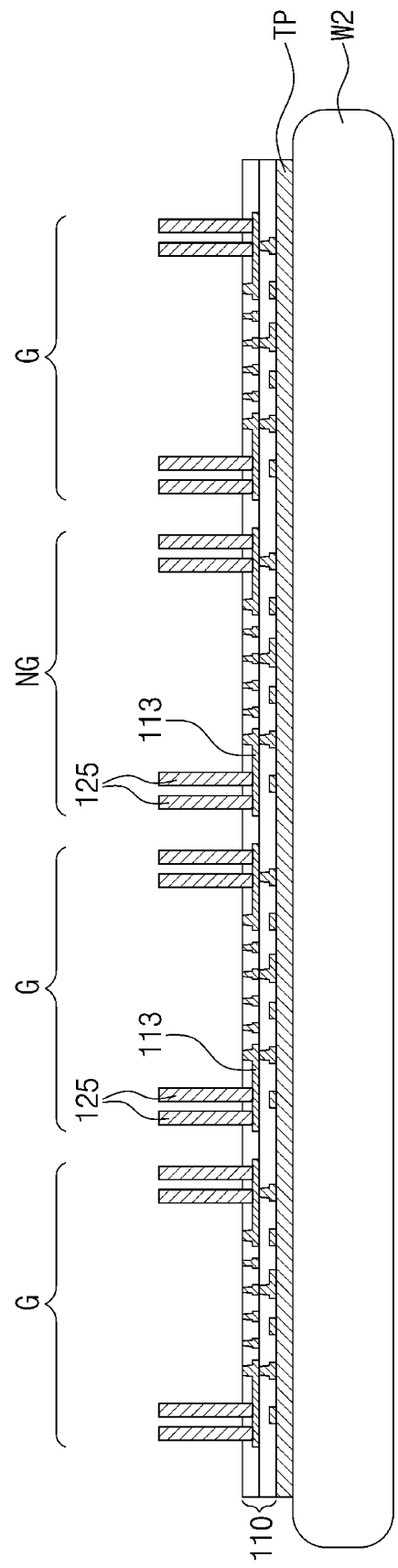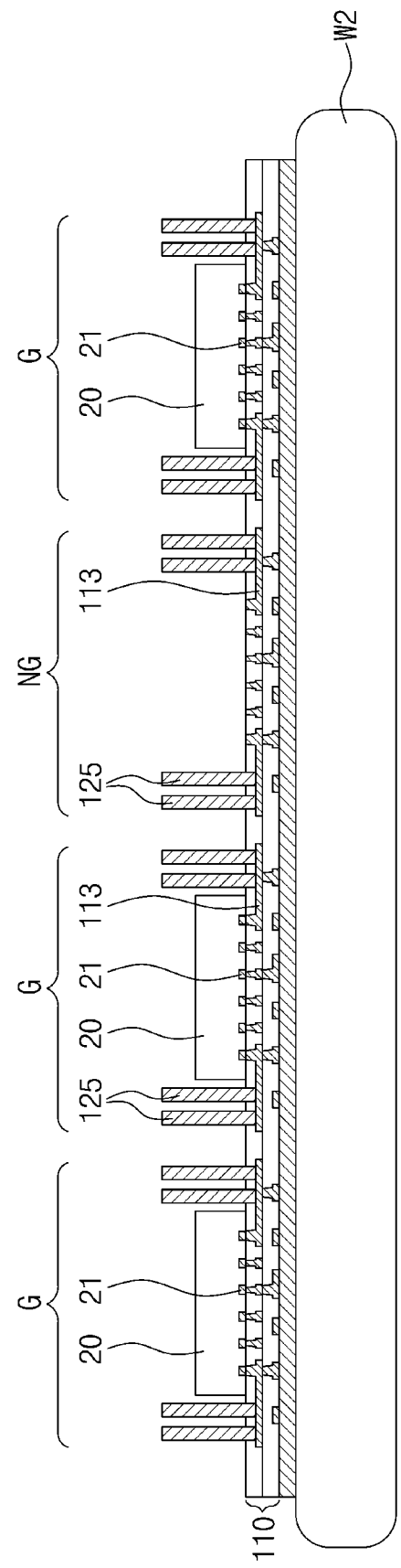

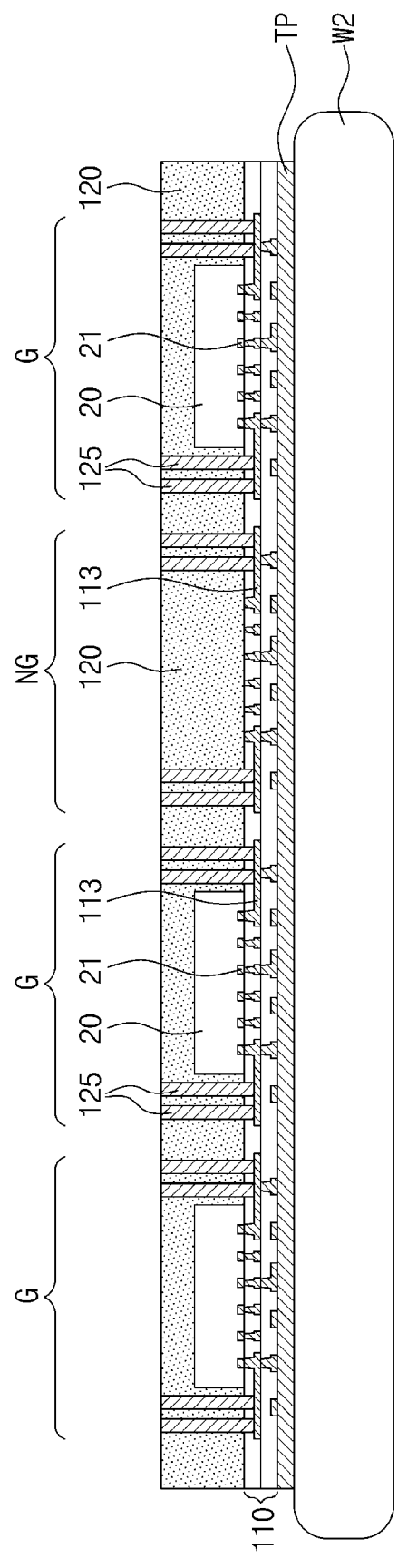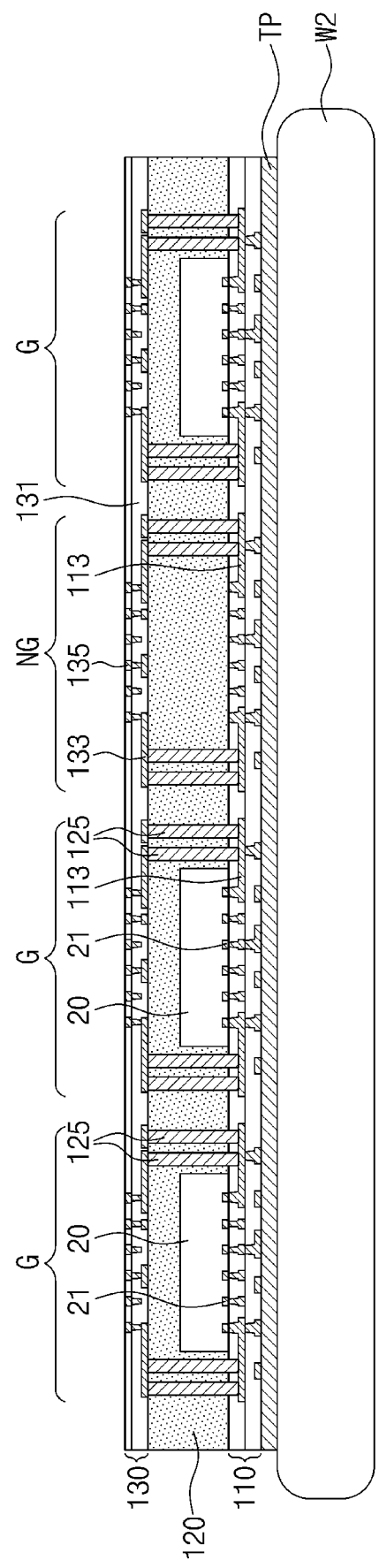

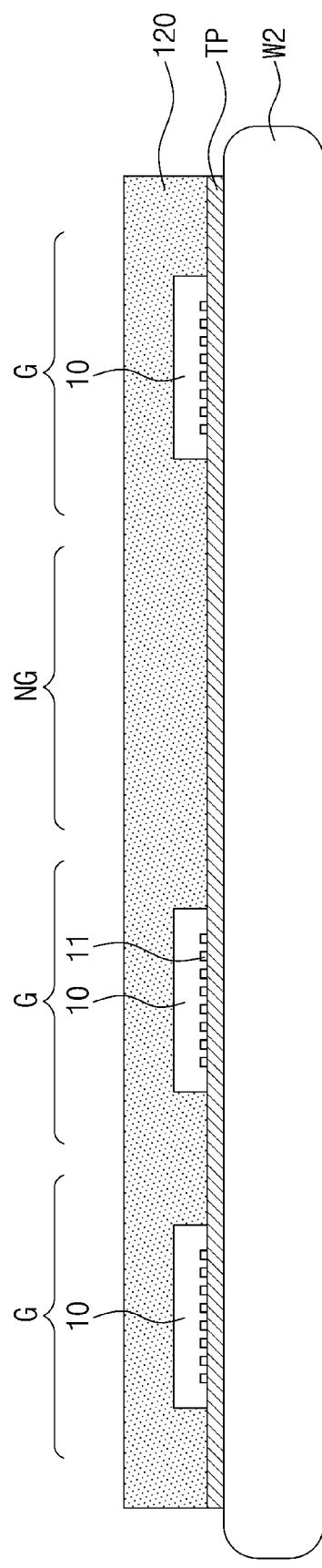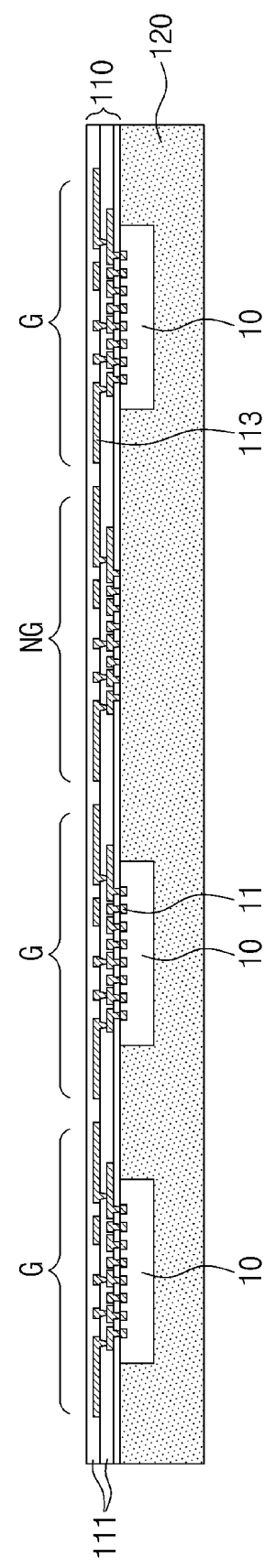

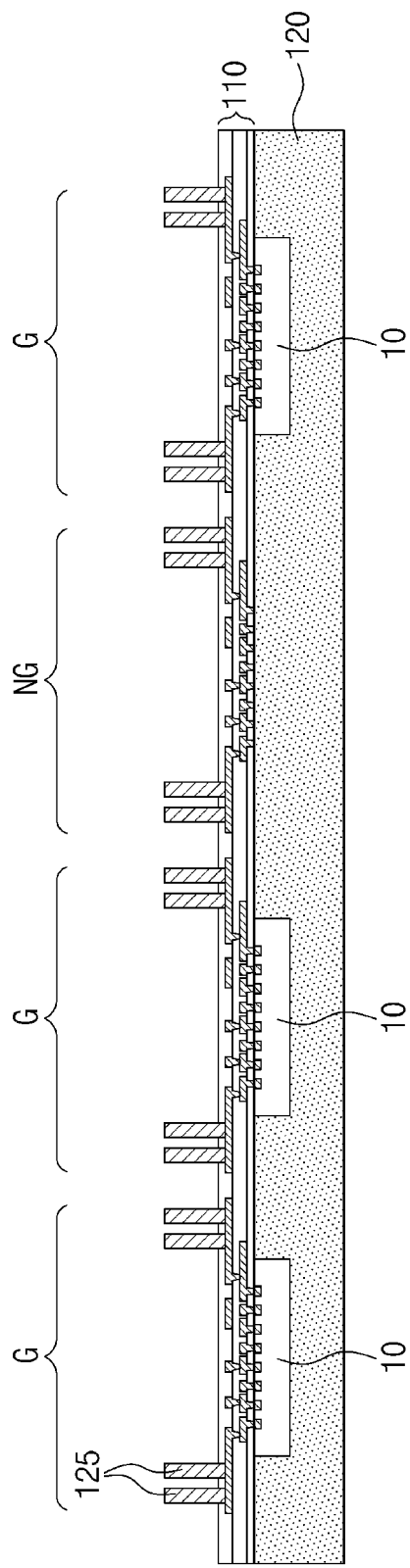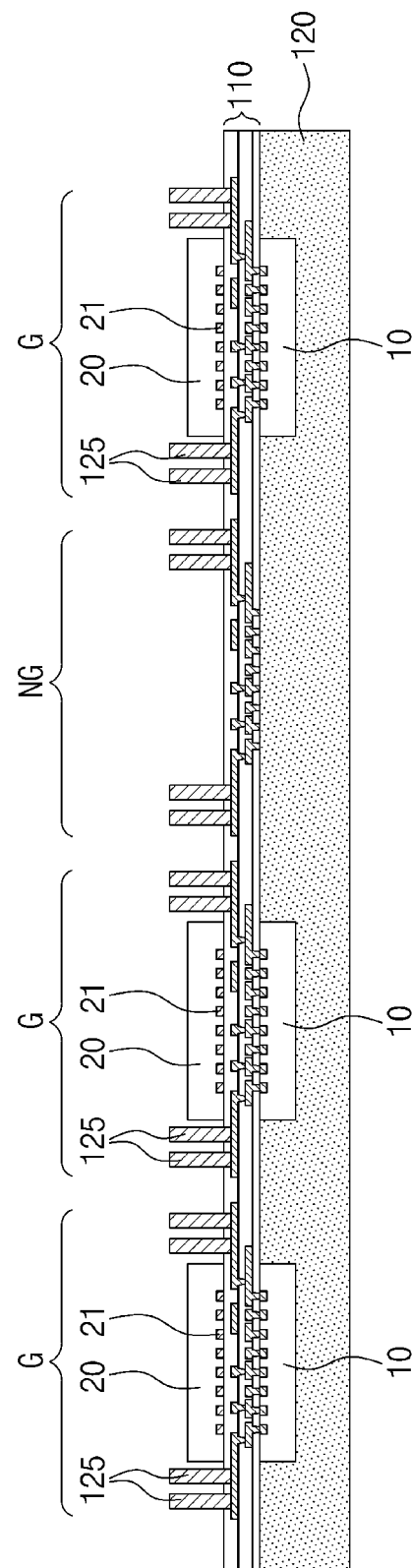

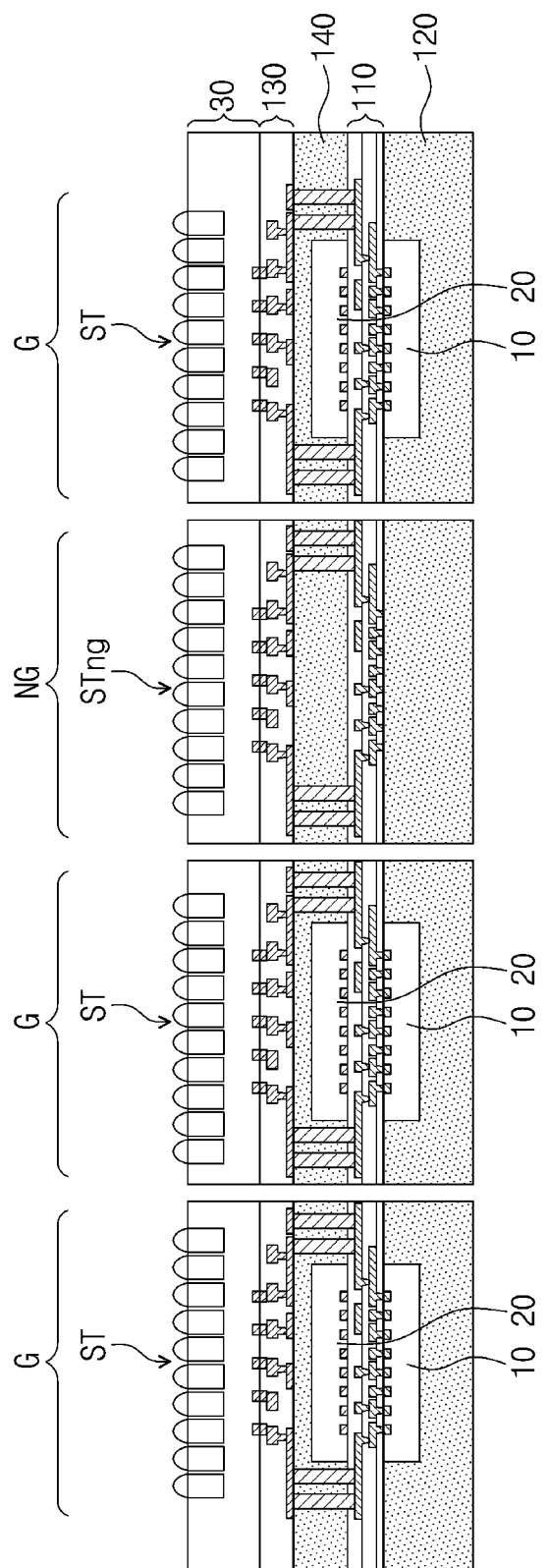

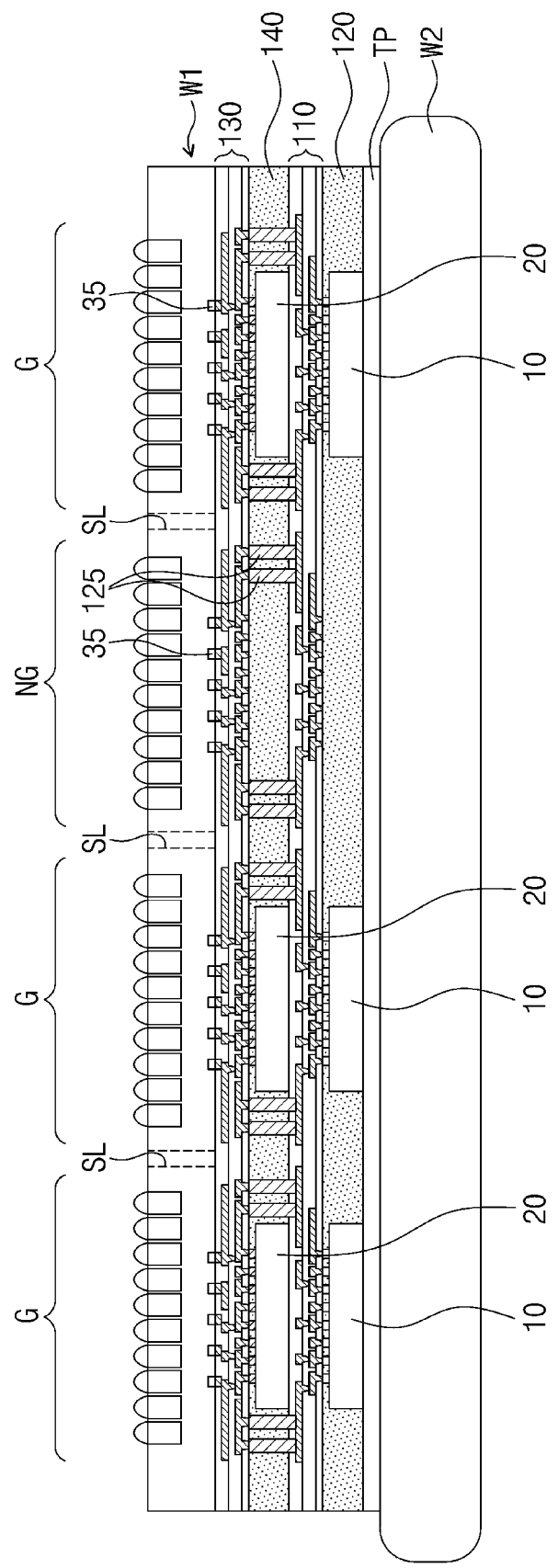

SEMICONDUCTOR PACKAGE AND METHOD OF MANUFACTURING THE SAME

PRIORITY STATEMENT

This U.S. nonprovisional application claims priority under 35 U.S.C. § 119 to Korean Patent Application No. 10-2018-0110044 filed on Sep. 14, 2018 in the Korean Intellectual Property Office, the entire contents of which are hereby incorporated by reference.

BACKGROUND

The present inventive concepts relate to a semiconductor package and to a method of manufacturing the same. More particularly, the present inventive concepts relate to a multi-chip semiconductor package and to a method of manufacturing the same. For example, the present inventive concepts relate to an image sensor realized in the form of a multi-chip semiconductor package and to a method of manufacturing the same.

Trends in today's electronics industries are to fabricate lightweight, compact, high speed, multi-functional and high performance products at reasonable prices. A multi-chip stacked package technique or a system-in-package technique is used to meet these trends.

As compared to a single chip semiconductor package, a multi-chip stacked package or a system-in-package may perform a number of functions corresponding to those of unit semiconductor devices. Although the multi-chip stacked package or the system-in-package may be somewhat thicker than a typical single chip package, they have a planar size similar to that of a single chip package and thus are primarily used for high-end, compact, and portable products such as mobile phones, laptop computers, memory cards, or portable camcorders.

SUMMARY

According to the present inventive concepts, there is provided a semiconductor package including a first redistribution layer, a first semiconductor chip on the first redistribution layer, a molding layer on the first redistribution layer and covering the first semiconductor chip, a plurality of metal pillars around the first semiconductor chip and connected to the first redistribution layer, the metal pillars extending axially vertically through the molding layer; a second redistribution layer on the molding layer and connected to the metal pillars, and a second semiconductor chip on the second redistribution layer. When viewed in plan, the second semiconductor chip may overlap the first semiconductor chip and the metal pillars.

Also according to the present inventive concepts, there is provided a semiconductor package including a first redistribution layer having opposite upper and lower sides and comprising a first body of dielectric material and redistribution wiring including a layer of electrically conductive patterns within the first body of dielectric material, a first semiconductor chip disposed on the lower side of the first redistribution layer and electrically connected to the redistribution wiring of the first redistribution layer, a second semiconductor chip disposed on the upper side of the first redistribution layer and electrically connected to the redistribution wiring of the first redistribution layer, a molding layer on the upper side of the first redistribution layer and encapsulating the second semiconductor chip on the first redistribution layer, electrically conductive pillars each extending axially through the molding layer laterally of the second semiconductor chip and electrically connected to the redistribution wiring of the first redistribution layer, a second redistribution layer on the molding layer and comprising a second body of dielectric material and redistribution wiring including a layer of electrically conductive patterns within the second body of dielectric material, and a third semiconductor chip on the second redistribution layer. The redistribution wiring of the second redistribution layer is electrically connected to the pillars. The third semiconductor chip have chip pads facing the second redistribution layer and electrically connected to the redistribution wiring of the second redistribution layer. When viewed in plan, the third semiconductor chip overlaps the second semiconductor chip and the pillars.

Also according to the present inventive concepts, there is provided a semiconductor package including a first layer including a first semiconductor chip, a second layer stacked on the first layer and including a second semiconductor chip, a molding layer encapsulating the second semiconductor chip, a third layer stacked on the second layer and including a third semiconductor chip, a first redistribution layer interposed between the first layer and the second layer, the first redistribution layer comprising a first body of dielectric material and redistribution wiring including a layer of electrically conductive patterns within the first body of dielectric material, a second redistribution layer interposed between the second layer and the third layer, the second redistribution layer comprising a second body of dielectric material and redistribution wiring including a layer of electrically conductive patterns within the second body of dielectric material, and electrically conductive pillars extending axially through the molding layer laterally of the second semiconductor chip. When viewed in plan, the third semiconductor chip overlaps the second semiconductor chip and the pillars. The molding layer is sandwiched between the first body of dielectric material and the second body of dielectric material. The redistribution wiring of the second redistribution layer electrically connects the third semiconductor chip to the pillars, the redistribution wiring of the first redistribution layer electrically connects to first semiconductor chip to the pillars, and the redistribution wiring of one of the first and second redistribution layers electrically connects the second semiconductor chip to the pillars.

Also according to the present inventive concepts, there is provided a method of manufacturing a semiconductor package including obtaining a wafer map from a first substrate that includes a plurality of first semiconductor chips, the wafer map including a coordinate of a bad chip; using the wafer map to place a plurality of second semiconductor chips on a second substrate that includes a plurality of normal regions and an abnormal region, wherein the abnormal region may correspond to the coordinate of the bad chip, and wherein the second semiconductor chips may be placed on corresponding normal regions; forming on the second substrate a molding layer that covers the second semiconductor chips; forming on a first surface of the molding layer a first redistribution layer that includes a plurality of first redistribution patterns connected to the second semiconductor chips; forming a substrate stack by combining the first substrate with the first redistribution layer; and cutting the substrate stack to form a plurality of chip stacks that are separated from each other.

BRIEF DESCRIPTION OF THE DRAWINGS

FIGS. 6A, 6B, 6C, 6D, 6E, 6F, 6G and 6H are cross-sectional views of a semiconductor package during the course of its manufacture and together illustrate a method of manufacturing the semiconductor package according to the present inventive concepts.

FIGS. 16A, 16B, 16C, 16D, 16E, 16F, 16G, 16H and 16I are cross-sectional views of wafer structures during the course of a manufacturing process and together illustrate an example of a wafer-level method of manufacturing a semiconductor package according to the present inventive concepts.

FIGS. 17A, 17B, 17C, 17D, 17E, 17F and 17G are cross-sectional views of wafer structures during the course of a manufacturing process and together illustrate an example of a wafer-level method of manufacturing a semiconductor package according to the present inventive concepts.

DETAILED DESCRIPTION

Examples of a semiconductor package and a method of manufacturing the same according to the present inventive concepts will now be described in detail in conjunction with the accompanying drawings. In the present disclosure, ordinal numbers, e.g., "first", "second", "third", etc. are used merely for purposes of description to differentiate one like element from another in a given example. Therefore, ordinal numbers may be used differently among the respective examples and do not particularly limit the present inventive concepts as disclosed hereinafter.

Figure 1:
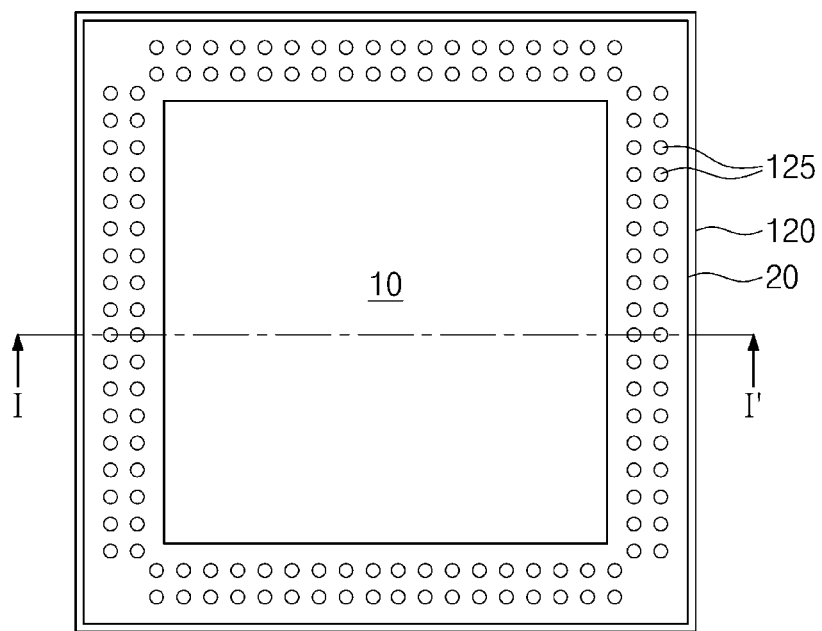
FIG. 1 is a simplified plan view of examples of semiconductor packages according to the present inventive concepts.
Figure 2:
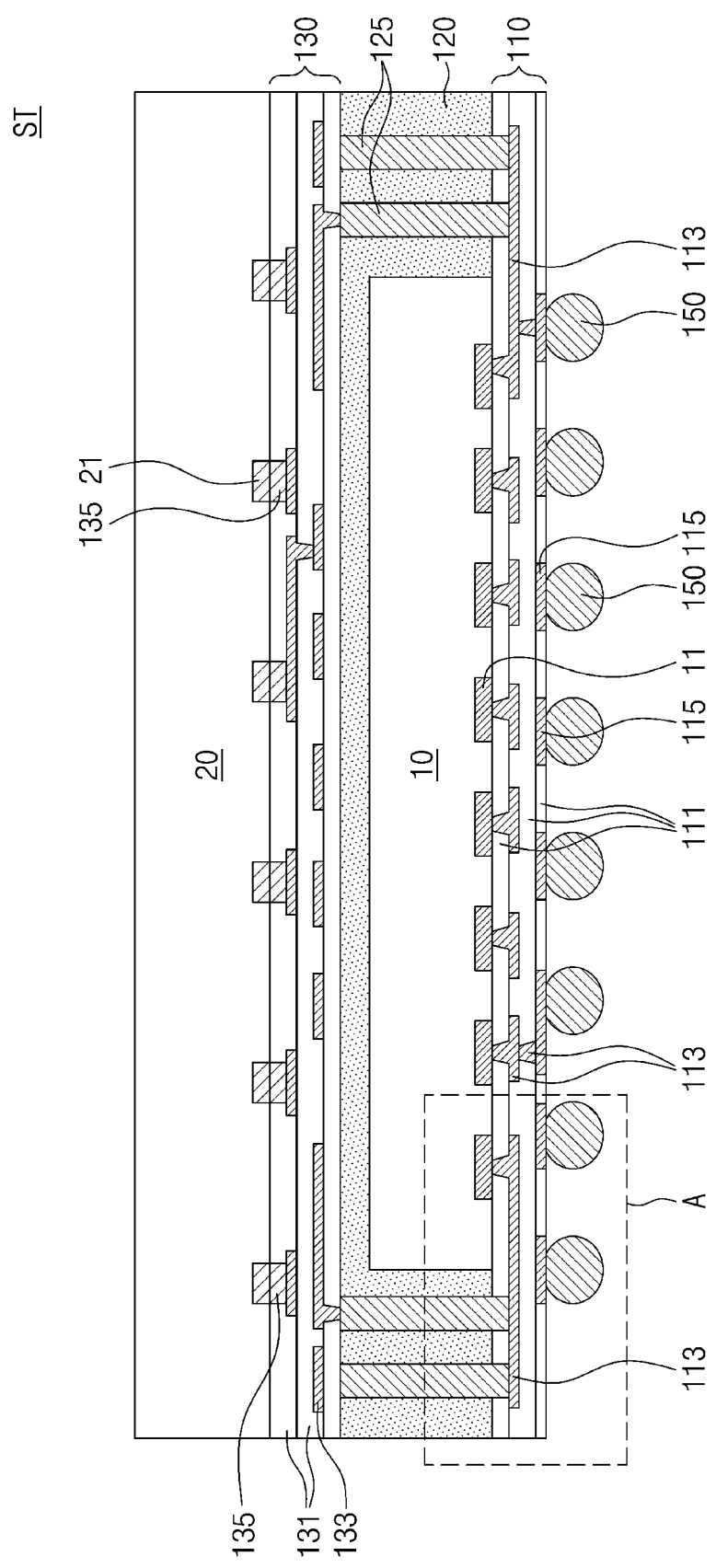
FIG. 2 is a cross-sectional view taken along line I-I' of FIG. 1, of an example of a semiconductor package according to the present inventive concepts.
Figure 3:
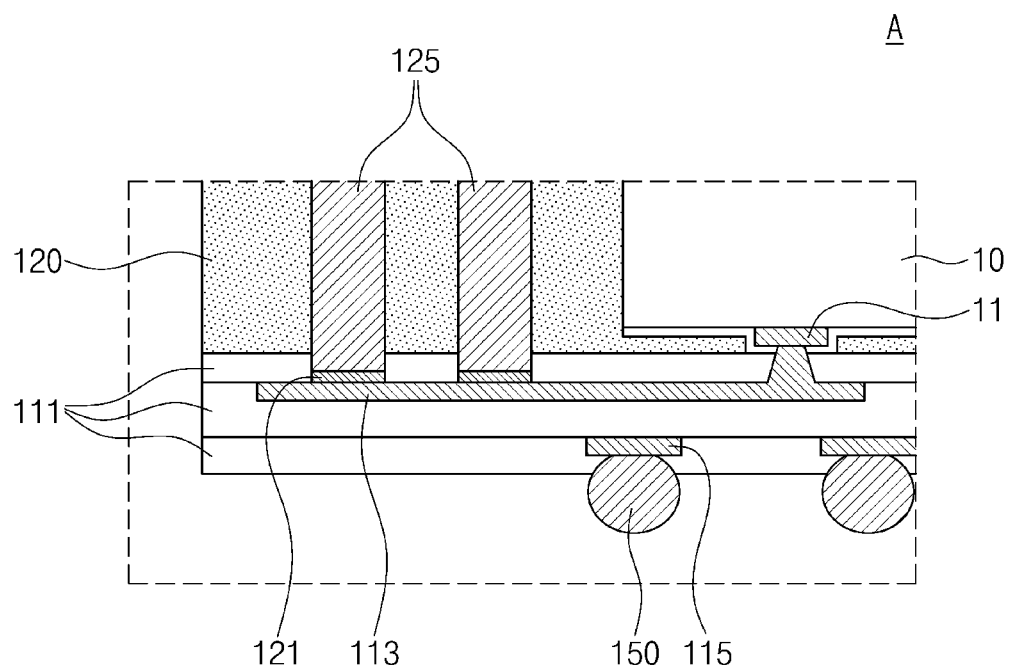
FIG. 3 is an enlarged view of section A of FIG. 2.

A first example of a semiconductor package ST is illustrated in FIGS. 1-3.

Referring to FIGS. 1 and 2, the semiconductor package ST may include a first redistribution layer 110, a first semiconductor chip 10, metal pillars 125, a molding layer 120, a second redistribution layer 130, and a second semiconductor chip 20.

The first redistribution layer 110 may include a plurality of first dielectric layers 111, a plurality of first redistribution patterns 113, and a plurality of first connection pads 115.

The first redistribution patterns 113 may be disposed between the first dielectric layers 111, and may include via segments that extend vertically through the first dielectric layers 111 and line segments that extend along surfaces of the first dielectric layers 111. The first redistribution patterns 113 at different levels may be electrically connected to each other. The first redistribution patterns 113 may be electrically connected to chip pads 11 of the first semiconductor chip 10. The first redistribution patterns 113 may include signal lines that apply electrical signals and power lines that apply ground or power voltages.

The first connection pads 115 may be provided on a bottom surface of the first redistribution layer 110, and the first dielectric layer 111 may be provided thereon with a lower passivation layer that exposes the first connection pads 115. The lower passivation layer may include a different dielectric material from that of the first dielectric layers 111. The first connection pads 115 may have attached thereto external connection terminals 150 such as solder balls or solder bumps. For example, the first redistribution layer 110 may be provided on its bottom surface with the external connection terminals 150 that constitute a ball grid array (BGA). The external connection terminals 150 may be electrically connected through the first redistribution layer 110 to the first semiconductor chip 10 and the metal pillars 125.

The first semiconductor chip 10 may be disposed on a central portion of the first redistribution layer 110. The first semiconductor chip 10 may include the chip pads 11 on a bottom surface thereof. The chip pads 11 may be electrically connected to the first redistribution layer 110, and may input/output electrical signals to/from (the integrated circuit of) the first semiconductor chip 10. The arrangement and sizes of the chip pads 11 may depend on device characteristics and type of the first semiconductor chip 10.

The first semiconductor chip 10 may be a logic chip that calculates and processes data, which logic chip may be a central processing unit (CPU) or an image signal processing chip. Alternatively, the first semiconductor chip 10 may be a memory chip that stores data, which memory chip may be a dynamic random access memory (DRAM) chip, a static random access memory (SRAM) chip, a flash memory chip, a PRAM chip, a RRAM chip, a FeRAM chip, or an MRAM chip.

The metal pillars 125 may be disposed on the first redistribution layer 110 around the first semiconductor chip 10. The metal pillars 125 may be electrically connected to select ones of the first redistribution patterns 113.

Each of the metal pillars 125 may have a cylindrical shape and a length greater than a thickness of the first semiconductor chip 10. In such cases, the metal pillars 125 may have their top surfaces at a higher level than that of a top surface of the first semiconductor chip 10. For example, each of the metal pillars 125 may have a length of about 100 µm to about 150 µm, and also have a diameter of about 5 µm to about 10 µm.

The metal pillars 125 may include, for example, copper (Cu) or an alloy thereof. In this description, copper alloy refers to copper mixed with an extremely small amount of one or more of C, Ag, Co, Ta, In, Sn, Zn, Mn, Ti, Mg, Cr, Ge, Sr, Pt, Mg, Al, and Zr.

The molding layer 120 may be provided on the first redistribution layer 110 to cover the top surface of the first semiconductor chip 10. The molding layer 120 may fill gaps between the metal pillars 125. The molding layer 120 may include a dielectric polymer, such as an epoxy molding compound (EMC). The molding layer 120 may be thicker than the first semiconductor chip 10, and may have a top surface coplanar with those of the metal pillars 125.

The second redistribution layer 130 may be provided on the molding layer 120 and may be electrically connected to the metal pillars 125. The second redistribution layer 130 may include a plurality of second dielectric layers 131 and a plurality of second redistribution patterns 133. The second dielectric layers 131 may cover an entire surface of the molding layer 120, and the second redistribution patterns 133 may be disposed between the second dielectric layers 131 and between the second dielectric layer 131 and the molding layer 120. The second redistribution patterns 133 may include via segments that extend vertically through the second dielectric layers 131 and line segments that extend along surfaces of the second dielectric layers 131. The second redistribution patterns 133 at different levels may be electrically connected to each other.

Portions of the second redistribution patterns 133 may be exposed by the second dielectric layer 131 and used as connection pads. For example, the second redistribution layer 130 may include second connection pads 135 at an uppermost layer thereof. The second connection pads 135 of the second redistribution layer 130 may be provided in correspondence with chip pads 21 of the second semiconductor chip 20 disposed on the second redistribution layer 130. The arrangement and sizes of the second connection pads 135 may be substantially the same as those of the chip pads 21 of the second semiconductor chip 20 disposed on the second redistribution layer 130. The second connection pads 135 may include a metal. For example, the second connection pads 135 may be formed of copper (Cu), nickel (Ni), cobalt (Co), tungsten (W), titanium (Ti) or tin (Sn), or an alloy of such a metal.

The second semiconductor chip 20 may be disposed on the second redistribution layer 130, and electrically connected through the second redistribution layer 130 to the metal pillars 125. The second semiconductor chip 20 may be electrically connected to the first semiconductor chip 10 through the second redistribution layer 130, the metal pillars 125, and the first redistribution layer 110.

The second semiconductor chip 20 may have a different function from that of the first semiconductor chip 10. For example, when the first semiconductor chip 10 is a logic chip, the second semiconductor chip 20 may be a memory chip, or vice versa. Alternatively, the second semiconductor chip 20 may have the same function as that of the first semiconductor chip 10.

When viewed in plan, the second semiconductor chip 20 may overlap the metal pillars 125 and the first semiconductor chip 10. The second semiconductor chip 20 and the molding layer 120 may have substantially the same width in first and second horizontal directions intersecting, e.g., perpendicular to, each other. For example, the lateral surfaces of the second semiconductor chip 20 may be vertically aligned with and substantially coplanar with those of the molding layer 120.

As alluded to above, the chip pads 21 of the second semiconductor chip 20 may be provided in correspondence with the second connection pads 135 of the second redistribution layer 130, and may have substantially the same size and arrangement as those of the second connection pads 135 of the second redistribution layer 130. The chip pads 21 of the second semiconductor chip 20 may be directly connected to the second connection pads 135 of the second redistribution layer 130.

The bottom surface of the second semiconductor chip 20 may contact the second dielectric layer 131 of the second redistribution layer 130, and the chip pads 21 of the second semiconductor chip 20 may contact the second connection pads 135 of the second redistribution layer 130. The chip pads 21 of the second semiconductor chip 20 may include a metal. For example, the chip pads 21 may be formed of copper (Cu), nickel (Ni), cobalt (Co), tungsten (W), titanium (Ti) or tin (Sn), or an alloy of one of such metals.

Referring to FIG. 3, a passivation layer may be disposed on the bottom surface of the first semiconductor chip 10, and may have openings that expose corresponding chip pads 11. The chip pads 11 of the first semiconductor chip 10 may be connected to the via segments of the first redistribution patterns 113. The first redistribution patterns 113 may extend from the chip pads 11 toward a periphery of the first semiconductor chip 10 and beyond a side surface of the first semiconductor chip 10.

The metal pillars 125 may be disposed on the first redistribution patterns 113, and a metal seed pattern and a metal barrier pattern 121 may be disposed between each metal pillar 125 and a respective first redistribution pattern 113. The metal barrier pattern 121 may include a double layer of materials or a compound including a material selected from the group consisting of titanium, titanium nitride, tantalum, tantalum nitride, ruthenium, cobalt, manganese, tungsten nitride, nickel, nickel boride, and titanium/titanium nitride. The metal seed pattern may be pattern of or including copper (Cu).

Figure 4:
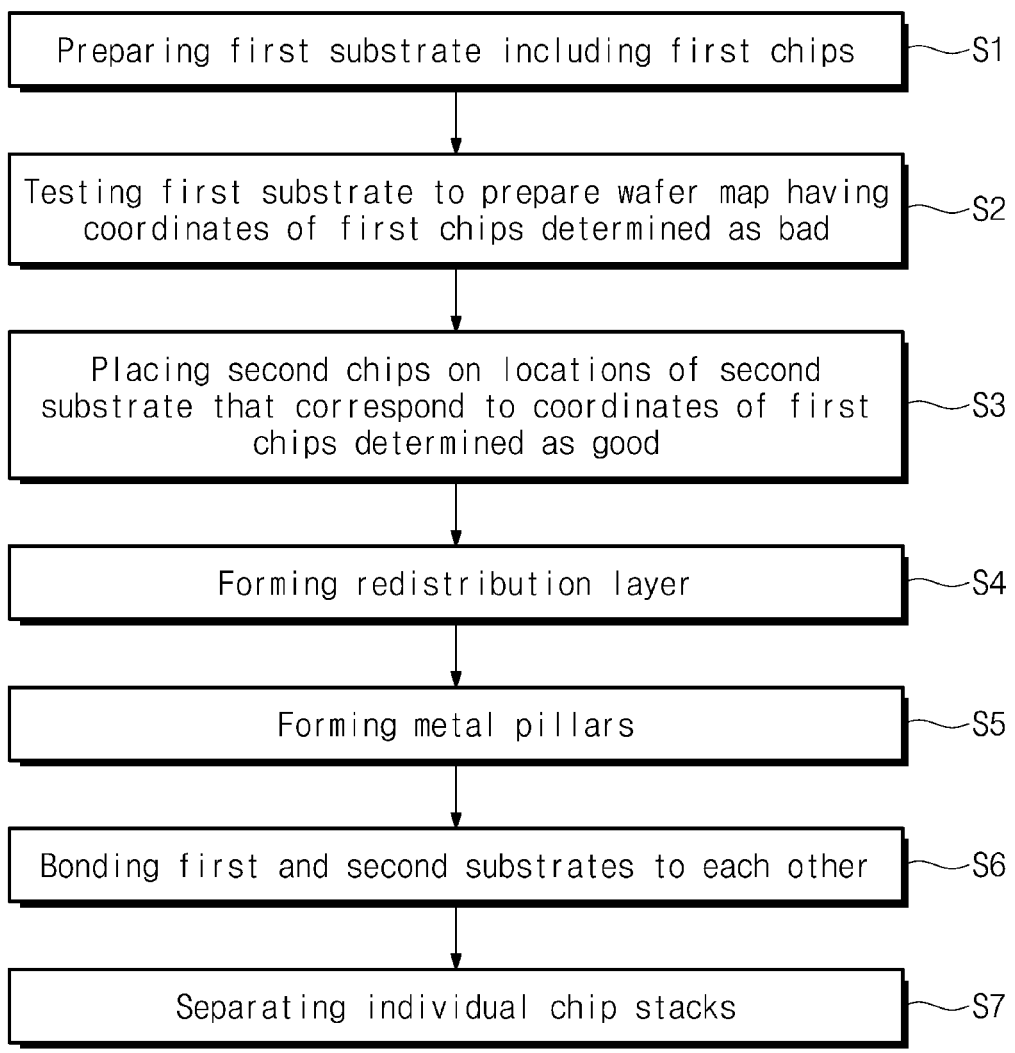
FIG. 4 is a flow chart of an example of a method of manufacturing a semiconductor package according to the present inventive concepts.
Figure 5:
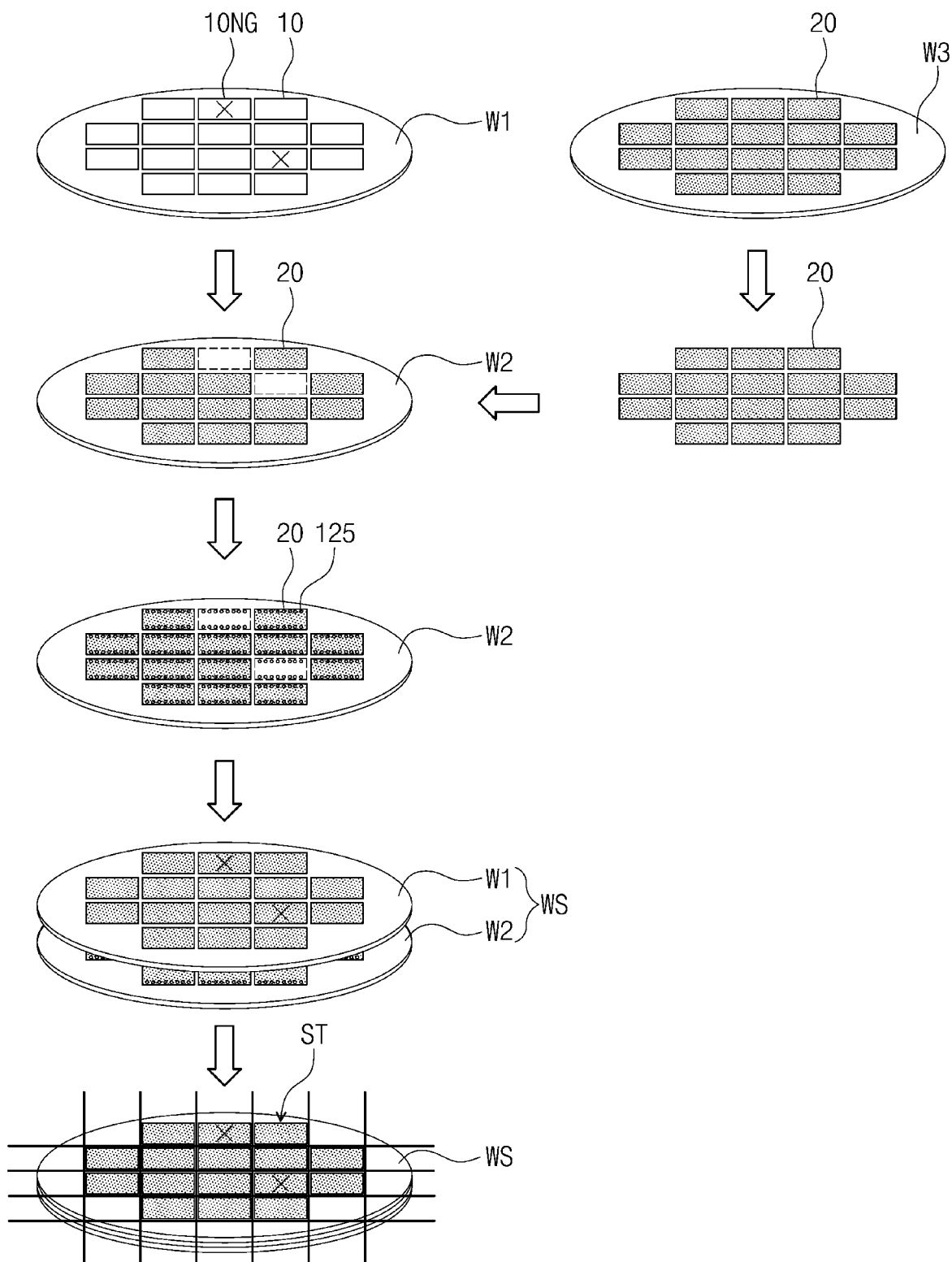
FIG. 5 is a process flow diagram of a method of manufacturing a semiconductor package according to the present inventive concepts.

A method of manufacturing a semiconductor package according to the present inventive concepts is illustrated by the flow chart of FIG. 4 and the process flow diagram of FIG. 5.

Referring to FIGS. 4 and 5, a first substrate W1 is prepared on which first semiconductor chips 10 are formed (S1). The first semiconductor chips 10 may be formed in a plurality of rows and columns, i.e., a two-dimensional array of the first semiconductor chips is formed on the first substrate W1. The first semiconductor chips 10 may include good chips that operate normally and bad chips LONG that operate abnormally.

An electrical test may be performed on each of the first semiconductor chips 10, and then test results of the first semiconductor chips 10 may be stored as a wafer map (S2). The wafer map may have information about coordinates and defects of the first semiconductor chips 10. At the very least, the wafer map contains information by which the location of any of the bad chips 10NG can be determined.

A substrate W3 is prepared on which second semiconductor chips 20 are formed, and a test process is performed on each of the second semiconductor chips 20. After the test process is performed on the second semiconductor chips 20, the substrate W3 is diced along a scribe lane to separate the second semiconductor chips 20 from each other.

The second semiconductor chips 20 may be two-dimensionally arranged in a plurality of rows and columns on a second substrate W2 (S3). The second semiconductor chips 20 may be attached through an adhesive to the second substrate W2. The wafer map obtained from the test process on the first substrate W1 is used to arrange the second semiconductor chips 20 on the second substrate W2. In certain examples, the second semiconductor chips 20 may be disposed on locations of the second substrate W2 corresponding to coordinates of the first semiconductor chips 10 determined as good. No second semiconductor chips 20 are disposed on locations that correspond to coordinates of the first semiconductor chips 10 determined as bad, i.e., those locations are left empty.

A redistribution layer is formed on the second substrate W2 (S4). Metal pillars 125 connected to the redistribution layer are formed around each of the second semiconductor chips 20 (S5).

A substrate stack WS is formed by bonding the first substrate W1 to the second substrate W2 on which the redistribution layer and the metal pillars 125 are formed (S6). When the first substrate W1 is bonded to the second substrate W2, no second semiconductor chips 20 are present below the first semiconductor chips 10 determined as bad. The bonding of the first substrate W1 to the second substrate W2 electrically connects the first semiconductor chips 10 determined as good to the second semiconductor chips 20 through the redistribution layer and the metal pillars 125.

Subsequently, a dicing, e.g., cutting, process may be performed along a scribe lane of the substrate stack WS, resulting in the forming of chips stacks ST or semiconductor packages separated from each other (S7).

According to an example of a method of manufacturing, no second semiconductor chips 20 are arranged on the locations of the second substrate W2 that correspond to the coordinates of the bad chips 10NG present on the first substrate W1. Therefore, the second semiconductor chips 20 determined as good are prevented from being wasted due to the bad chips 10NG present on the first substrate W1. Therefore, a method of manufacturing a semiconductor package according to the present inventive concepts may provide a high manufacturing yield.

An example of a method of manufacturing a semiconductor package according to the present inventive concepts is also illustrated in FIGS. 6A to 6H.

Referring to FIG. 6A, a first substrate W1 may be prepared on which first semiconductor chips 10 are formed. The first substrate W1 may include chip regions on which the first semiconductor chips 10 are formed and scribe lane regions SL surrounding the chip regions. The first semiconductor chips 10 may be two-dimensionally arranged in rows and columns. The first semiconductor chips 10 may be surrounded by the scribe lane regions SL.

The first semiconductor chips 10 may be memory chips, such as DRAM (dynamic random access memory), SRAM (static random access memory), NAND Flash memory or RRAM (resistive random access memory) chips.

Alternatively, the first semiconductor chips 10 may be logic chips, such as MEMS (Micro Electro Mechanical System) device, optoelectronic device, CPU (Central Processing Unit), GPU (Graphic Processing Unit), mobile applications or DSP (digital signal processor) chips.

Each of the first semiconductor chips 10 may include chip pads 11 on a bottom surface thereof. As described above with reference to FIGS. 4 and 5, the first substrate W1 may undergo an electrical test to prepare a wafer map having coordinate data of the first semiconductor chips 10 determined as bad.

Referring to FIG. 6B, a first redistribution layer 110 may be formed on a second substrate W2. An adhesive layer TP may be interposed between the second substrate W2 and the first redistribution layer 110.

In certain examples, the second substrate W2 is determined to have normal regions G to be provided with second semiconductor chips 20, as will be described below, and abnormal regions NG not to be provided with semiconductor chips 20. The normal and abnormal regions G and NG may have their coordinates provided by the wafer map obtained from the first substrate W1.

The forming of the first redistribution layer 110 may include forming a first dielectric layer 111, forming first redistribution patterns 113 on the first dielectric layer 111, forming other first dielectric layer 111 covering the first redistribution patterns 113, and forming first connection pads connected to the first redistribution patterns 113.

When the first redistribution layer 110 is formed, the first redistribution patterns 113 may be formed both on the normal regions G and on the abnormal regions NG. The forming of the first redistribution patterns 113 may include forming a metal seed layer on the first dielectric layer 111 having via holes, forming a photoresist pattern (not shown) on the metal seed layer, forming a metal pattern by performing a plating process on the metal seed layer exposed by the photoresist pattern, and using the metal pattern as an etching mask to selectively etch the metal seed layer. The metal seed layer may be formed by a film deposition process such as electroplating, electroless plating, or sputtering. The metal seed layer may be formed of, for example, chromium (Cr), titanium (Ti), copper (Cu), nickel (Ni) or tin (Sn), or an alloy of one of such metals.

Referring to FIG. 6C, metal pillars 125 may be formed on each of the normal and abnormal regions G and NG as electrically connected to the first redistribution layer 110.

The forming of the metal pillars 125 may include forming a mask pattern (not shown) having openings that partially expose the first redistribution layer 110, performing an electroplating process to fill the openings with a metallic material, and removing the mask pattern. A seed layer may be formed before the metal pillars 125 so as to be located between the first redistribution layer 110 and each of the metal pillars 125.

The metal pillars 125 may be formed from floors of the openings, and may have cylindrical shapes or parallelepipedal, e.g., square pillar, shapes. The metal pillars 125 may be formed of, for example, copper (Cu), cobalt (Co), chromium (Cr), titanium (Ti), nickel (Ni) or tin (Sn), or an alloy of one of such metals. In certain examples, the metal pillars 125 have the same regular arrangement and structure on both the normal and abnormal regions G and NG.

Referring to FIG. 6D, second semiconductor chips 20 may be disposed on the first redistribution layer 110. The second semiconductor chips 20 may be connected through solder balls to the first redistribution layer 110. The second semiconductor chips 20 may be the same as the first semiconductor chips 10, or may have different functions from those of the first semiconductor chips 10. Each of the second semiconductor chips 20 may include chip pads 21 on a bottom surface thereof. For example, the second semiconductor chips 20 may be oriented with the chip pads 21 facing the second substrate W2. The second semiconductor chips 20 may have their top surfaces at a lower level than that of top surfaces of the metal pillars 125.

As described above with reference to FIGS. 4 and 5, the second semiconductor chips 20 may be dies that are individually separated from the third substrate W3 and determined to be good (dies on the third substrate W3 that pass an electrical test). The second semiconductor chips 20 determined to be good may be two-dimensionally arranged in a plurality of rows and columns.

In certain examples, as described above with reference to FIGS. 4 and 5, a wafer map obtained from the first substrate W1 may be used to place the second semiconductor chips 20 on the first redistribution layer 110. For example, the second semiconductor chips 20 may be attached to corresponding normal regions G of the second substrate W2, and the abnormal regions NG of the second substrate W2 may be left empty.

Referring back to FIG. 6E, a molding layer 120 may be formed on the second substrate W2. The molding layer 120 may be formed thick enough to cover all of the second semiconductor chips 20. Therefore, the molding layer 120 may have a top surface at a higher level than that of the top surfaces of the second semiconductor chips 20. The molding layer 120 may expose the top surfaces of the metal pillars 125. For example, the top surface of the molding layer 120 may be located at substantially the same level as that of the top surfaces of the metal pillars 125. The molding layer 120 may be formed of a dielectric polymer, for example, an epoxy-based polymer.

Referring to FIG. 6F, a second redistribution layer 130 may be formed on the top surface of the molding layer 120.

The forming of the second redistribution layer 130 may include forming a second dielectric layer 131 on the molding layer 120, forming via holes that extend through the second dielectric layer 131 and expose the metal pillars 125, and forming second redistribution patterns 133 that fill the via holes and extend onto a top surface of the second dielectric layer 131.

The second dielectric layer 131 may be formed to cover an entire surface of the molding layer 120. The second dielectric layer 131 may be formed of a different dielectric material from that of the molding layer 120, which different dielectric material may include a silicon oxide layer, a silicon nitride layer, or a silicon oxynitride layer.

The second redistribution patterns 133 may be formed by a film deposition process such as electroplating, electroless plating, or sputtering, and likewise the first redistribution pattern 113, the second redistribution patterns 133 may each include a seed layer and a metal pattern. Portions of the second redistribution patterns 133 at an uppermost layer of the second redistribution layer 130 may be exposed by the second dielectric layer 131.

Second connection pads 135 may be formed by exposed portions of the second redistribution patterns 133. The second connection pads 135 may have their top surfaces substantially coplanar with that of the second dielectric layer 131. The second connection pads 135 may include a metallic material, for example, copper (Cu) or a copper alloy.

Each of the second connection pads 135 may include a metal barrier pattern and a metal seed pattern that are sequentially stacked. The metal barrier pattern may include a double layer of materials or a compound including a material selected from the group consisting of titanium, titanium nitride, tantalum, tantalum nitride, ruthenium, cobalt, manganese, tungsten nitride, nickel, nickel boride, or titanium/titanium nitride. The metal seed pattern may be a pattern of or including copper (Cu).

Figure 6G:
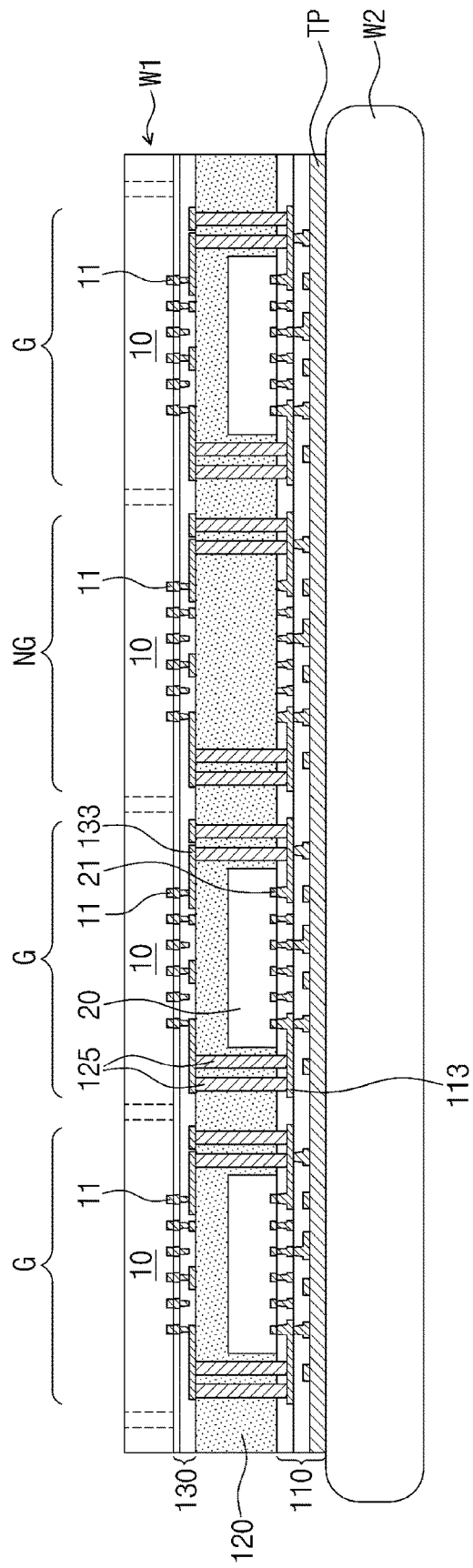

Referring to FIG. 6G, the first substrate W1 and the second substrate W2 that includes the second semiconductor chips 20 may be bonded to form a substrate stack. The first substrate W1 may be provided on the second substrate W2 such that the second connection pads 135 face the chip pads 11 of the first semiconductor chips 10 formed on the first substrate W1.

After the chip pads 11 of the first semiconductor chips 10 are in contact with the second connection pads 135, a thermocompression process may be performed to combine the first and second substrates W1 and W2 with each other. The thermocompression process may allow copper atoms of the chip pads 11 and the second connection pads 135 to mutually diffuse to eliminate boundaries between the chip pads 11 and the second connection pads 135. In such cases, the chip pad 11 and the second connection pad 135 may be formed into a single body.

The first semiconductor chips 10 determined as good may be connected to the second semiconductor chips 20 through the metal pillars 125 and the first and second redistribution layers 110 and 130. The first semiconductor chips 10 determined as bad may be connected to the second redistribution layer 130, but not to the second semiconductor chips 20.

Figure 6H:
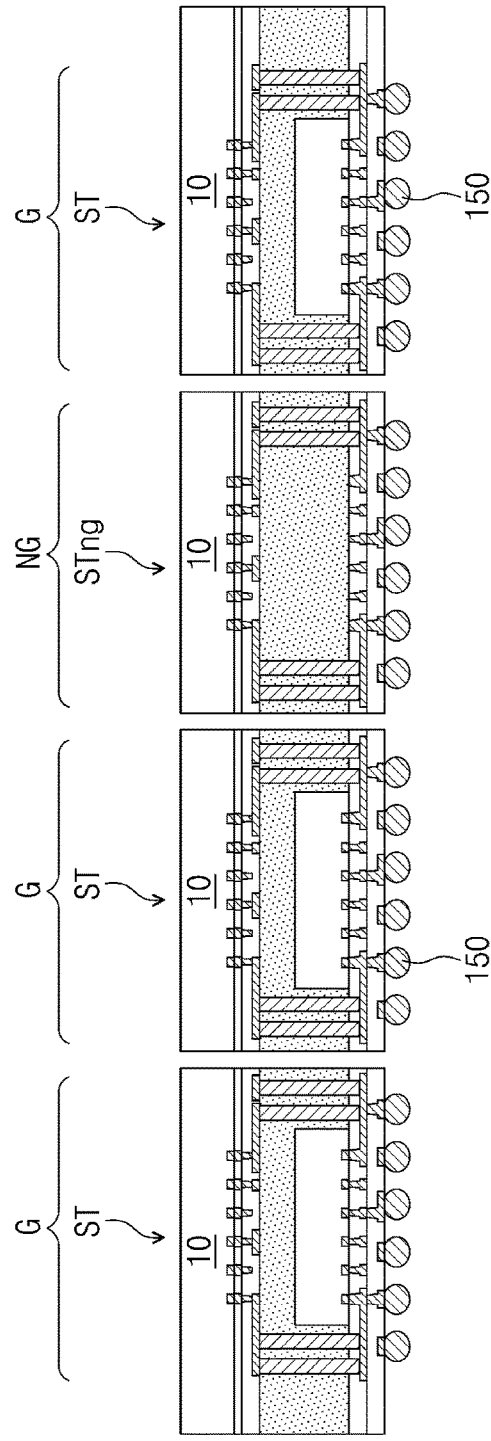

Referring to FIG. 6H, the substrate stack may undergo a cutting process performed along a scribe lane of the substrate stack, which may result in the forming of chip stacks ST, or semiconductor chips, individually separated from each other. The cutting process may use a sawing wheel (circular saw blade) or a laser. Each of the separated chip stacks ST may include the first and second semiconductor chips 10 and 20 that are stacked.

The separated chip stacks ST may include a bad chip "stack" STng consisting of the first semiconductor chip 10 determined as bad. Because the bad chip stack STng doe not include a second semiconductor chip 20 determined as good, the second semiconductor chips 20 determined as good are not wasted.

Before the cutting process on the substrate stack is preformed, external connection terminals 150 may be attached below the first redistribution layer 110. The external connection terminals 150 may be solder balls or bumps. When viewed in plan, select ones of the external connection terminals 150 may be disposed around the second semiconductor chips 20.

Figure 7:
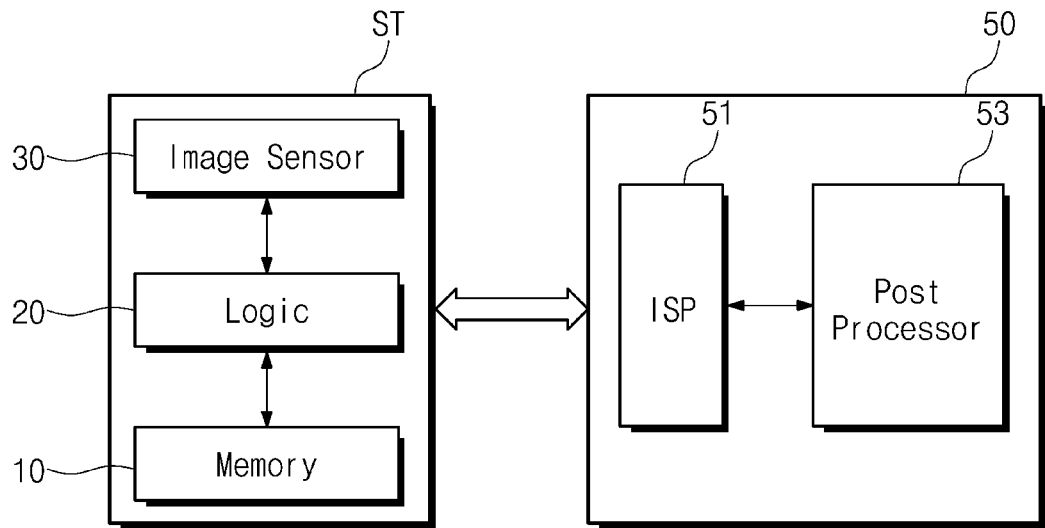
FIG. 7 is a block diagram of an electronic product employing a semiconductor package according to the present inventive concepts.

FIG. 7 illustrates an example of an electronic product according to the present inventive concepts. The electronic product includes a semiconductor package ST and image processing apparatus 50

The semiconductor package ST may be a semiconductor package having features similar to those described above with reference to FIGS. 1-3. The semiconductor package ST may be produced by a method similar to those described above with reference to FIGS. 4-6H. The semiconductor package ST may include a first semiconductor chip 10 (e.g., a memory chip which will be referred to hereinafter), a second semiconductor chip 20 (e.g., a logic chip which will be referred to hereinafter), and an image sensor chip 30. In certain examples, the memory chip 10, the logic chip 20, and the image sensor chip 30 are stacked in a direction perpendicular to a reference plane. Various examples of the semiconductor package ST will be described later on with reference to FIGS. 9-13.

The image sensor chip 30 may include a pixel array consisting of a plurality of unit pixels and may output pixel signals.

The logic chip 20 may be electrically connected to the memory chip 10 and the image sensor chip 30. The logic chip 20 may be configured to process pixel signals output from the image sensor chip 30. The logic chip 20 may include an analog-to-digital converter (ADC). An image processing apparatus 50 may receive image signals processed in the logic chip 20.

The pixel signals output from the pixel array of the image sensor chip 30 may be transferred to a plurality of analog-to-digital converters (ADC's) of the IC of the logic chip 20. The pixel signals processed in the logic chip 20 may be stored in a memory cell array of the IC of the memory chip 10.

The image processing apparatus 50 may include at least one image signal processor (ISP) 51 and a post-processor 53.

The image processing apparatus 50 may be configured such that images captured by the image sensor chip 30 may be output as a preview on a display (not shown), and when a capture command is input by a user, the images captured by the image sensor chip 30 may be stored in the memory chip 10.

The post-processor 53 may be configured to perform various operations to provide digital image signals converted from the images captured by the image sensor chip 30. For example, the post-processor 53 may perform diverse post-processing algorithms for contrast improvement, sharpness enhancement, noise removal, or the like that are not performed by the image signal processor 51. Outputs from the post-processor 53 may be provided to a video codec processor (not shown), and images processed in the video codec processor may be output on a display (not shown) or stored in the memory chip 10.

As is traditional in the field of the inventive concepts, the blocks which carry out the functions of the image processing apparatus 50 are physically implemented by microprocessors, microcontrollers, or the like, including firmware and/or software, e.g., one or more programmed microprocessors and associated circuitry. The circuits of the microprocessors, microcontrollers, or the like may be embodied in one or more semiconductor chips, or on substrate supports such as printed circuit boards and the like. The circuits constituting a block may be implemented by a processor or by a combination of dedicated hardware to perform some functions of the block and a processor to perform other functions of the block. Each block of the example may be physically separated into two or more interacting and discrete blocks without departing from the scope of the present inventive concepts. Likewise, the blocks may be physically combined into more complex blocks without departing from the scope of the present inventive concepts.

Figure 8:
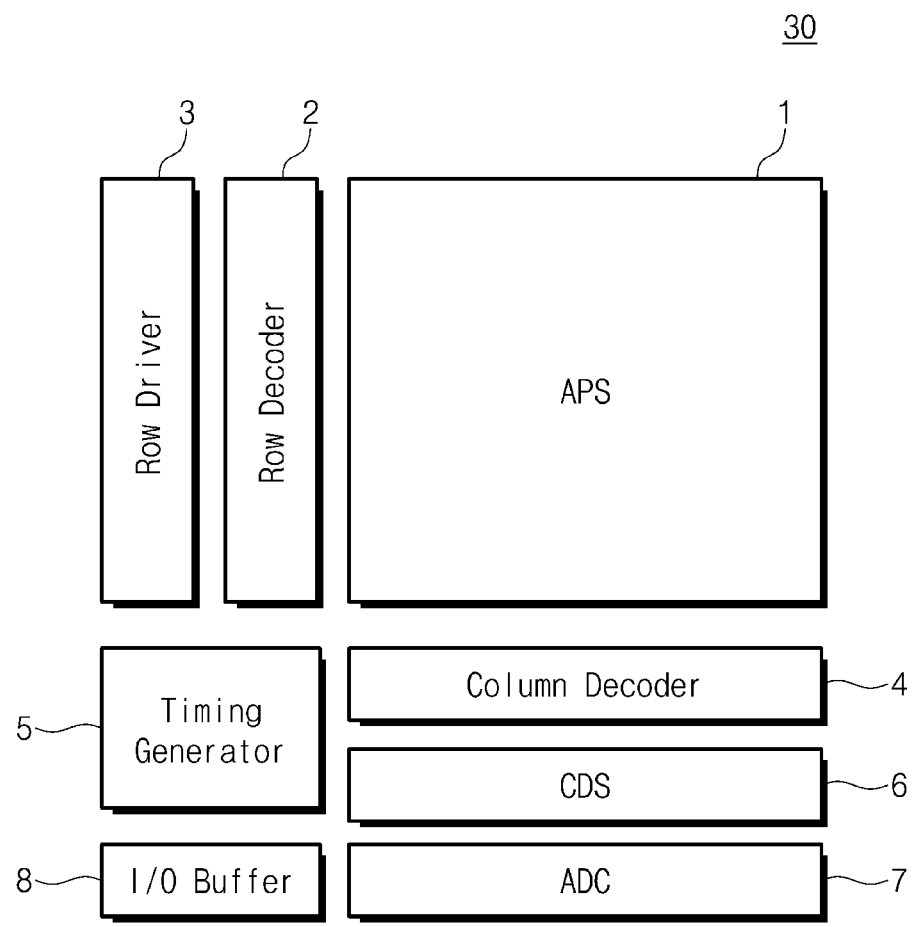
FIG. 8 is a block diagram of an example of the image sensor chip of an electronic product having a semiconductor package according to the present inventive concepts.

FIG. 8 illustrates an example of the image sensor chip 30 of the electronic product of FIG. 7 according to the present inventive concepts.

Referring to FIG. 8, the image sensor chip 30 of this example includes an active pixel sensor array (APS) 1, a row decoder 2, a row driver 3, a column decoder 4, a timing generator 5, a correlated double sampler (CDS) 6, an analog-to-digital converter (ADC) 7, and an input/output buffer (I/O buffer) 8.

The active pixel sensor array 1 may include a plurality of two-dimensionally arranged unit pixels, each of which is configured to convert optical signals into electrical signals. The active pixel sensor array 1 may be driven by a plurality of driving signals such as a pixel selection signal, a reset signal, and a charge transfer signal from the row driver 3. The converted electrical signals may be provided to the correlated double sampler 6.

The row driver 3 may provide the active pixel sensor array 1 with several driving signals for driving several unit pixels in accordance with a decoded result obtained from the row decoder 2. In case that the unit pixels are arranged in a matrix, the driving signals may be provided for respective rows.

The timing generator 5 may provide the row and column decoders 2 and 4 with timing and control signals.

The correlated double sampler (CDS) 6 may receive the electrical signals generated in the active pixel sensor array 1, and hold and sample the received electrical signals. The correlated double sampler 6 may perform a double sampling operation to sample a specific noise level and a signal level of the electrical signal, and then output a difference level corresponding to a difference between the noise and signal levels.

The analog-to-digital converter (ADC) 7 may convert analog signals, which correspond to the difference level received from the correlated double sampler 6, into digital signals, and then output the converted digital signals.

The input/output buffer 8 may latch the digital signals and then sequentially output the latched digital signals to an image signal processor (not shown) in response to the decoded result obtained from the column decoder 4.

Figure 9:
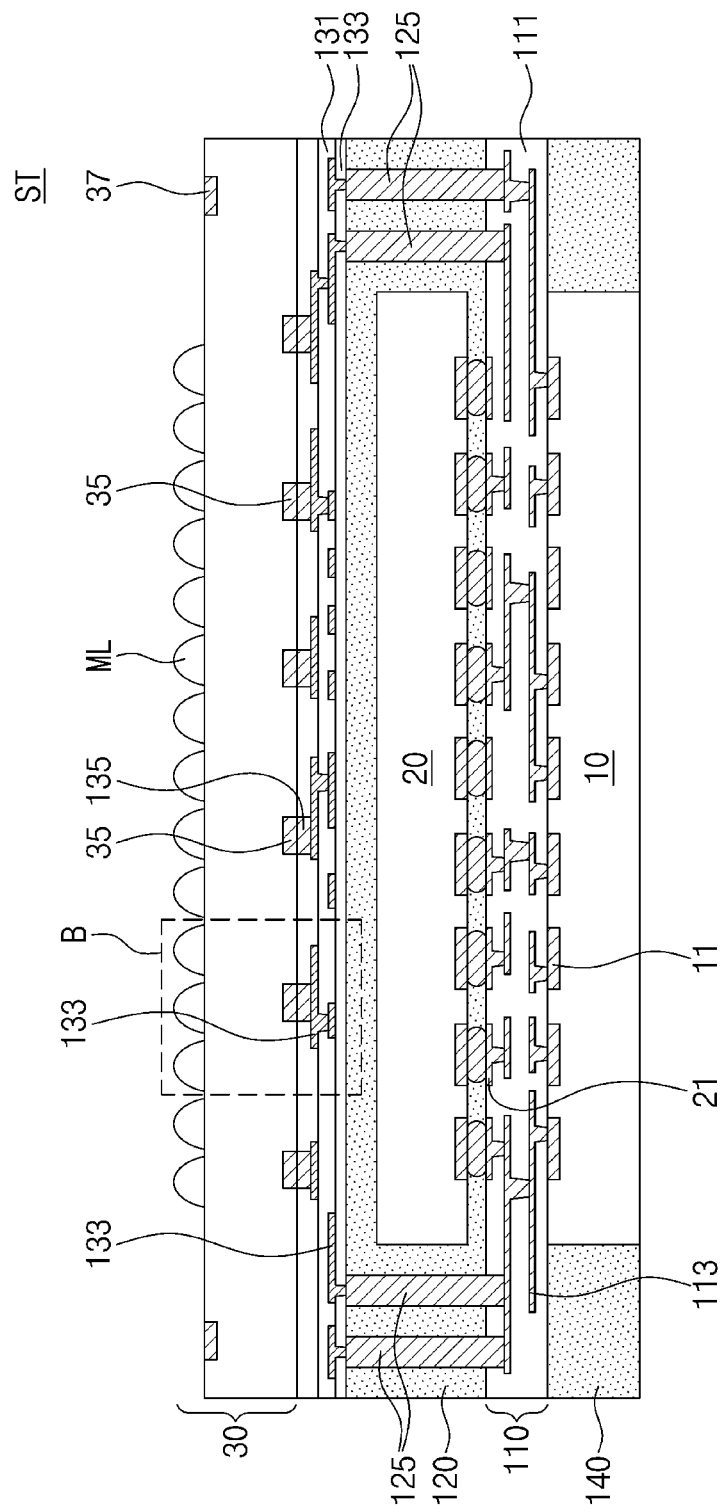
FIG. 9 is a cross-sectional view of an example of a semiconductor package according to the present inventive concepts.
Figure 10:
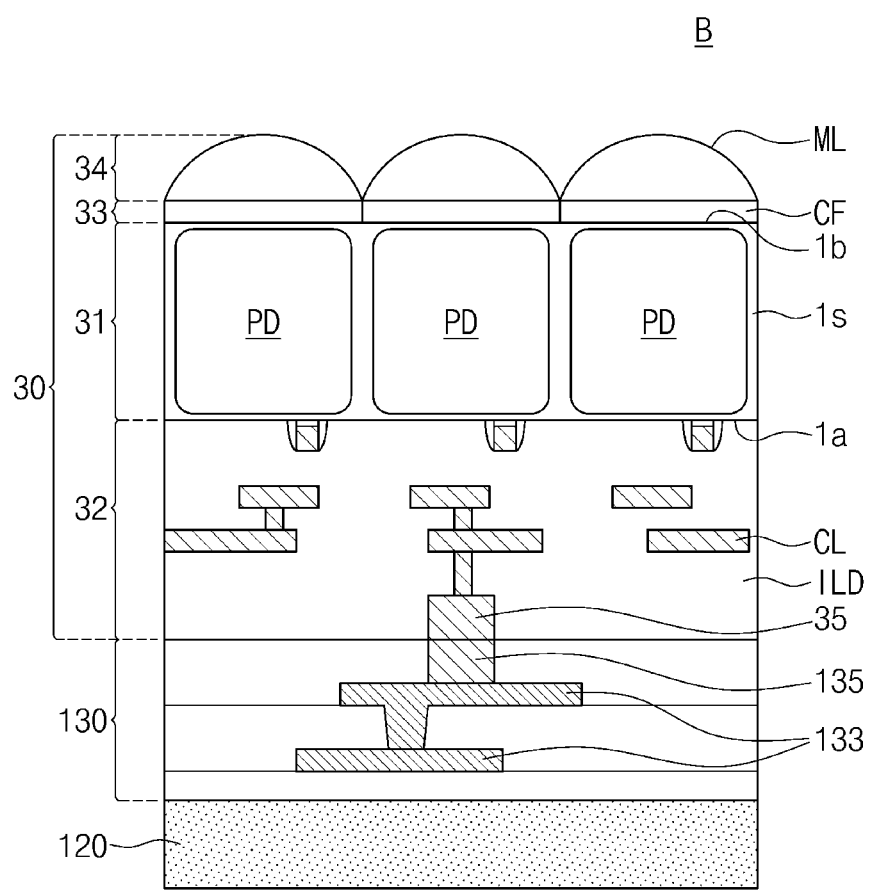
FIG. 10 is an enlarged view of section B of FIG. 9.

An example of a semiconductor package ST according to the present inventive concepts is illustrated by FIGS. 9 and 10.

Referring to FIGS. 9 and 10, the semiconductor package ST may include a logic chip 20 in a second or intermediate layer of the package, a memory chip 10 in a first or lower layer of the package, an image sensor chip 30 in a third or upper layer of the package, first and second redistribution layers 110 and 130, and first and second molding layers 120 and 140. The first molding layer 120 may constitute the first layer of the package with the logic chip 20. The second molding layer 140 may constitute the first layer of the package with the memory chip 10. The first redistribution layer 110 may be disposed between the logic chip 20 and the memory chip 10, i.e., between the first and second layers of the package. The second redistribution layer 130 may be disposed between the image sensor chip 30 and the logic chip 20, i.e., between the second and third layers of the package.

The first redistribution layer 110, as described above, may include a plurality of first dielectric layers 111 and a plurality of first redistribution patterns 113.

The logic chip 20 may have top and bottom surfaces facing in opposite directions. A plurality of chip pads 21 may be disposed on the bottom surface of the logic chip 20. For example, the logic chip 20 may be oriented with its bottom surface facing the first redistribution layer 110, and the chip pads 21 of the logic chip 20 may be connected to the first redistribution patterns 113 of the first redistribution layer 110. The chip pads 21 of the logic chip 20 may be formed of or include a metal, e.g., aluminum (Al) or copper (Cu).

The memory chip 10 may have top and bottom surfaces facing each other, and a plurality of chip pads 11 may be disposed on the top surface of the memory chip 10. For example, the memory chip 10 may be oriented with its top surface facing the first redistribution layer 110, and the chip pads 11 of the memory chip 10 may be connected to the first redistribution patterns 113 of the first redistribution layer 110. The memory chip 10 may include a memory cell array integrated on a silicon substrate, and the chip pads 11 may be connected to the memory cell array. The chip pads 11 of the memory chip 10 may be formed of or include a metal, e.g., aluminum (Al) or copper (Cu).

The first molding layer 120 covering the logic chip 20 may also extend between the first and second redistribution layers 110 and 130. The first molding layer 120 may be provided on a top surface of the first redistribution layer 110, and may cover the side and top surfaces of the logic chip 20. The first molding layer 120 may fill gaps between metal pillars 125, and may have a thickness substantially the same as a length of each of the metal pillars 125. The first molding layer 120 may be formed of a dielectric polymer such as an epoxy molding compound.

The metal pillars 125 may be disposed around, i.e., laterally of, the logic chip 20 and may electrically connect the first and second redistribution layers 110 and 130 to each other. The metal pillars 125 may extend vertically through the first molding layer 120, and may have their top surfaces coplanar with that of the first molding layer 120. The metal pillars 125 may have their bottom surfaces in contact with the first redistribution patterns of the first redistribution layer 110. The metal pillars 125 may thus extend through the second layer of the package. In this example, the metal pillars 125 are shown as extending into the first redistribution layer 110 but the present inventive concepts are not limited thereto.

The first redistribution layer 110 may be provided on its bottom surface with the second molding layer 140 that covers side surfaces of the memory chip 10 but not the bottom surface of the memory chip 10. The second molding layer 140 may prevent the memory chip 10 from being damaged by external impact, moisture, or other external forces or environmental conditions. The second molding layer 140 may be formed of a dielectric polymer such as an epoxy molding compound.

The second molding layer 140 may have a thermal conductivity less than that of the memory chip 10. For example, the second molding layer 140 may have a thermal conductivity of about 0.88 W/mK. Because the second molding layer 140 does not cover the bottom surface of the memory chip 10, when the semiconductor package ST is operated, heat generated from the memory chip 10 may be easily discharged outwardly through the silicon substrate of the memory chip 10.

The second redistribution layer 130 may be disposed on the first molding layer 120. The second redistribution layer 130, as described above, may include a plurality of second dielectric layers 131, a plurality of second redistribution patterns 133, and a plurality of second connection pads 135. Select ones of the second redistribution patterns 133 may be connected to the metal pillars 125.

The second connection pads 135 may be disposed on other ones of the second redistribution patterns 133, and may be exposed by the second dielectric layer 131.

The image sensor chip 30 may be provided on the second redistribution layer 130. The image sensor chip 30 may include a plurality of unit pixels that are two-dimensionally arranged in rows and columns. The unit pixels of the image sensor chip 30 may output electrical signals converted from an incident light.

When viewed in plan, the image sensor chip 30 may have a size greater than those of the logic chip 20 and the memory chip 10. For example, a width in one direction of the image sensor chip 30 may be greater than those of the logic chip 20 and the memory chip 10.

The image sensor chip 30 may have lateral surfaces substantially coplanar with those of the first and second molding layers 120 and 140. In such cases, when viewed in plan, the image sensor chip 30 may overlap the logic chip 20 and the metal pillars 125.

The image sensor chip 30 may have top and bottom surfaces facing in opposite directions. The image sensor chip 30 may be oriented with its bottom surface facing the second redistribution layer 130, and incident light may strike the top surface of the image sensor chip 30.

The image sensor chip 30 may include bonding pads 37 on the top surface thereof and also include chip pads 35 on the bottom surface thereof. The chip pads 35 may contact the second connection pads 135 of the second redistribution layer 130.

The chip pads 35 may include the same metallic material as that of the second connection pads 135 of the second redistribution layer 130. For example, the chip pads 35 may be formed of or include copper (Cu).

The image sensor chip 30 may be electrically connected to the logic chip 20 and the memory chip 10 through the metal pillars 125 and the first and second redistribution layers 110 and 130.

Referring to FIG. 10, the image sensor chip 30 may include a photoelectric conversion layer 31, a readout circuit layer 32, a color filter layer 33, and a micro-lens array 34.

When viewed in cross-section, the photoelectric conversion layer 31 may be disposed between the readout circuit layer 32 and the color filter layer 33. When viewed in cross-section, the color filter layer 33 may be disposed between the photoelectric conversion layer 31 and the micro-lens array 34.

The photoelectric conversion layer 31 may include a semiconductor substrate 1$s$ and photodiodes PD provided in the semiconductor substrate 1$s$. The semiconductor substrate 1$s$ may have a first surface 1$a$ (or a front surface) and a second surface 1$b$ (or a rear surface) facing away from the first surface 1$a$. The photodiodes PD may be impurity regions doped with impurities having a second conductive type (e.g., n-type) opposite to a first conductive type of the semiconductor substrate 1$s$. The photodiodes PD may convert external incident light into electrical signals.

The readout circuit layer 32 may be disposed on the first surface 1$a$ of the semiconductor substrate 1$s$. The readout circuit layer 32 may include readout circuits (e.g., circuitry composed of MOS transistors) connected to the photoelectric conversion layer 31. The readout circuit layer 32 may digitally process the electrical signals converted in the photoelectric conversion layer 31. For example, the first surface 1$a$ of the semiconductor substrate 1$s$ may be provided thereon with MOS transistors and connection lines CL connected to the MOS transistors. The connection lines CL may be stacked across interlayer dielectric layers ILD, and contact plugs may connect the connection lines CL located at different levels.

The readout circuit layer 32 may include the chip pads 35 on a bottom surface thereof. The chip pads 35 may have their bottom surfaces substantially coplanar with the bottom surface of the interlayer dielectric layer ILD.

The bottom surfaces of the chip pads 35 may contact the second connection pads 135 of the second redistribution layer 130, and the interlayer dielectric layer ILD of the readout circuit layer 32 may contact the second dielectric layer 131 of the second redistribution layer 130.

The connection pad 35 of the image sensor chip 30 and the second connection pad 135 of the second redistribution layer 130 may include the same metallic material, and may collectively form a single body without a boundary therebetween.

The color filter layer 33 may be disposed on the second surface 1$b$ of the semiconductor substrate 1$s$. The color filter layer 33 may include color filters CF corresponding to the photodiodes PD.

The micro-lens array 34 may be disposed on the color filter layer 33. The micro-lens array 34 may include a plurality of micro-lenses ML by which external incident light is focused, i.e., concentrated. The micro-lenses ML may be two-dimensionally arranged in rows and columns, and disposed in correspondence with the photodiodes PD.

Figure 11:
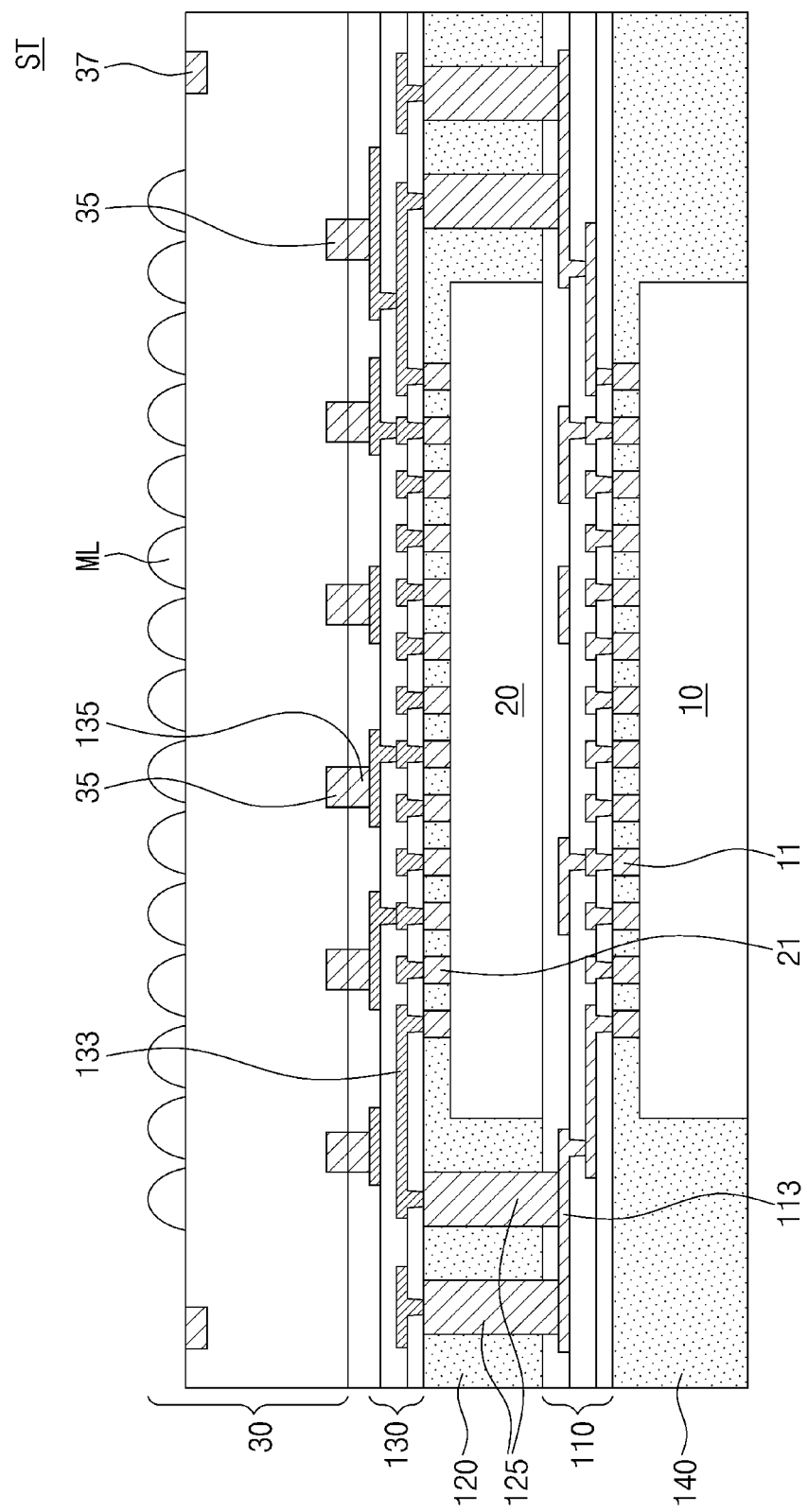
FIGS. 11, 12 and 13 are cross-sectional views of respective examples of a semiconductor package according to the present inventive concepts.
Figure 12:
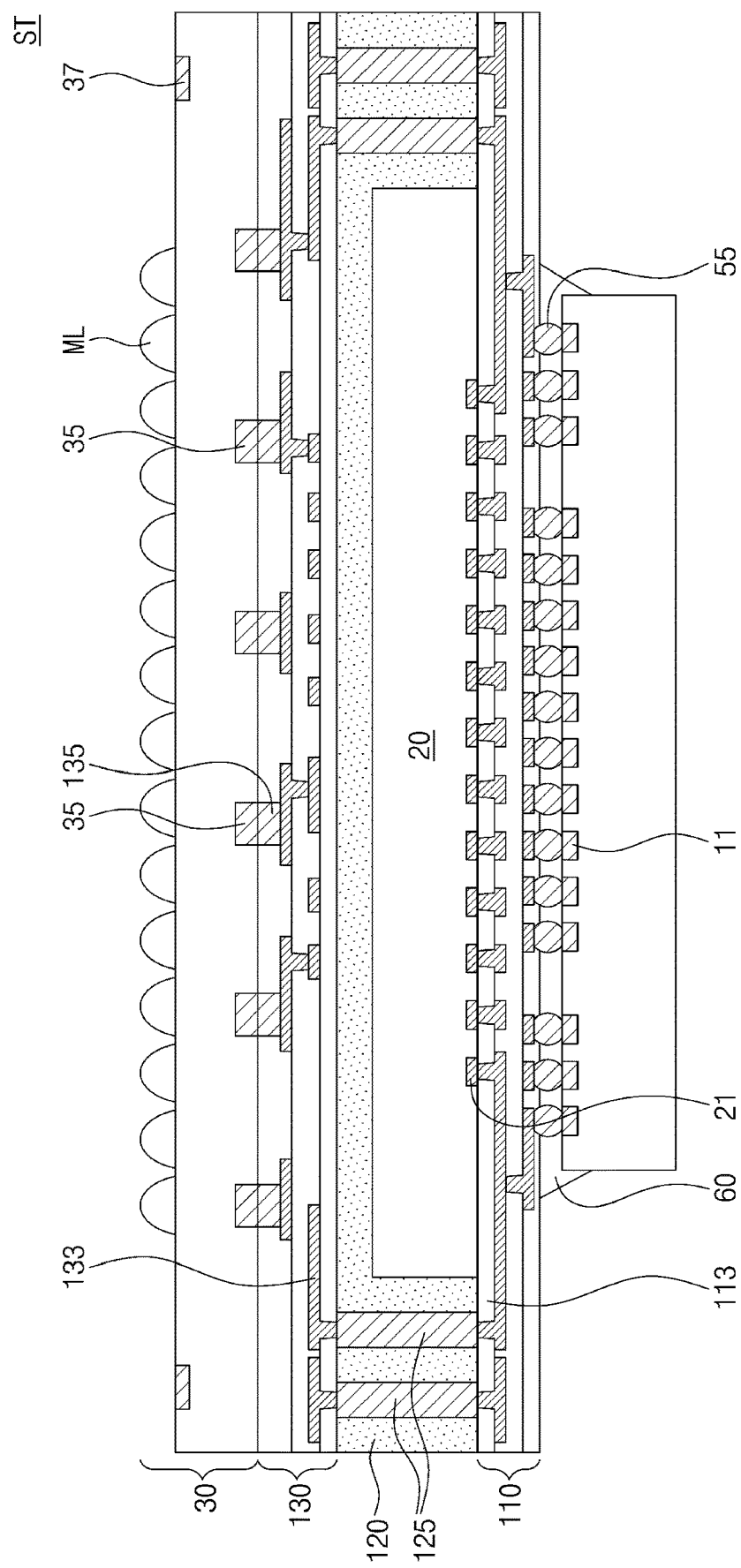
Figure 13:
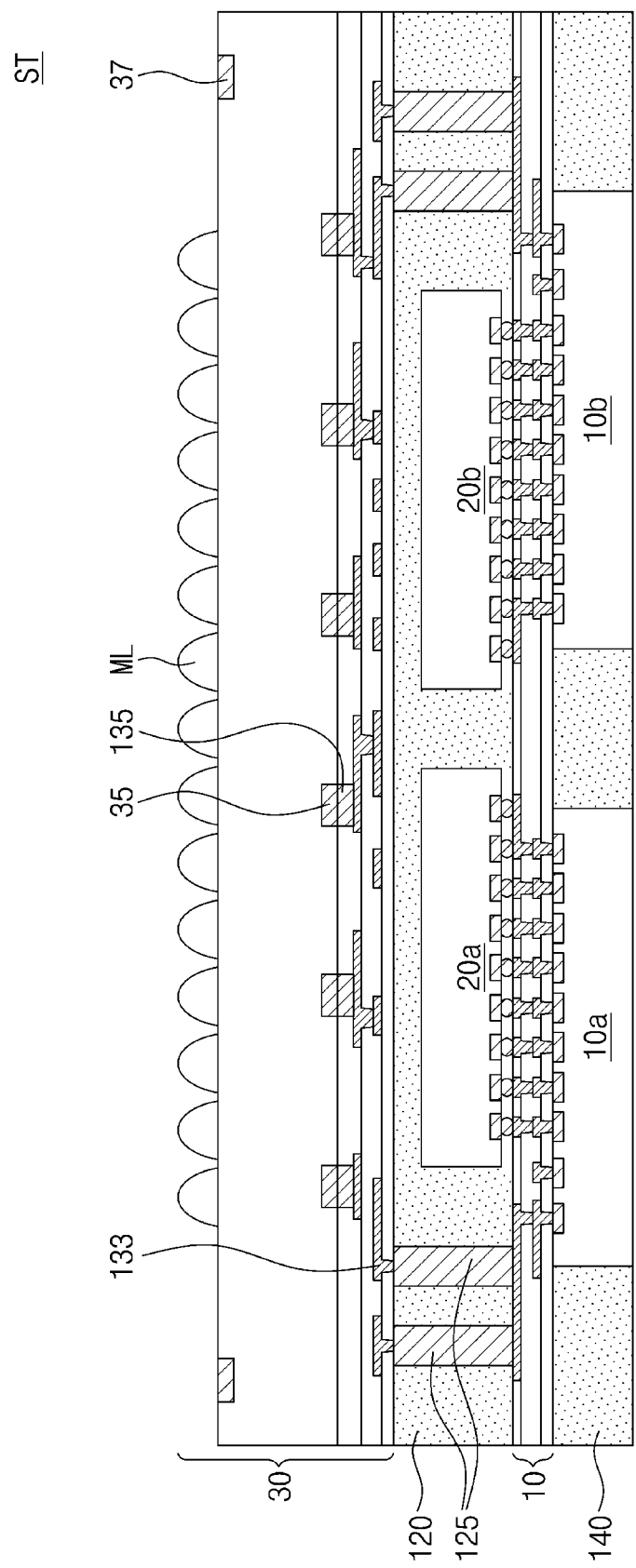

FIGS. 11 to 13 illustrate other examples of a semiconductor package according to the present inventive concepts. A detailed description of features of these examples similar to those of the examples described above, as indicated by like reference numerals, will be omitted for brevity and mainly the differences therebetween will be described.

Referring to FIG. 11, the logic chip 20 may be disposed between the first redistribution layer 110 and the second redistribution layer 130, and the second redistribution layer 130 may be disposed between the logic chip 20 and the memory chip 10.

The chip pads 21 of the logic chip 20 may be connected to the second redistribution patterns 133 of the second redistribution layer 130. The chip pads 21 of the logic chip 20 may have their top surfaces substantially coplanar with the top surface of the first molding layer 120, and the logic chip 20 may have a bottom surface substantially coplanar with that of the first molding layer 120. The first molding layer 120 may fill gaps between the chip pads 21 of the logic chip 20.

The chip pads 11 of the memory chip 10 may be connected to the first redistribution patterns 113 of the first redistribution layer 110. The second molding layer 140 may have a top surface substantially coplanar with those of the chip pads 11 of the memory chip 10. The second molding layer 140 may fill gaps between the chip pads 11 of the memory chip 10.

Referring to FIG. 12, the first redistribution layer 110 may be disposed between the logic chip 20 and the memory chip 10, and connection terminals 55 may be used to mount the memory chip 10 on the first redistribution layer 110. The memory chip 10 may have a width less than that of the logic chip 20.

The connection terminals 55 may be conductive bumps, conductive pillars, solder balls, or a combination thereof. The connection terminals 55 may comprise at least one material selected from the group consisting of copper, tin, and lead.

An under-fill layer 60 may be interposed between the memory chip 10 and the first redistribution layer 110. The under-fill layer 60 may fill gaps between the connection terminals 55. The under-fill layer 60 may include a thermosetting resin or a photocurable resin. The under-fill layer 60 may further include an inorganic filler or an organic filler.

Referring to FIG. 13, first and second logic chips 20a and 20b may be disposed on a central portion of the first redistribution layer 110, and the metal pillars 125 may be disposed around the central portion of the first redistribution layer 110.

The first molding layer 120 may cover top and lateral surfaces of the first and second logic chips 20a and 20b. The first and second logic chips 20a and 20b may be electrically connected to the metal pillars 125 through the first redistribution patterns 113 of the first redistribution layer 110.

The first redistribution layer 110 may be provided thereon with first and second memory chips 10a and 10b that correspondingly face the first and second logic chips 20a and 20b.

The first and second memory chips 10a and 10b may be electrically connected to the metal pillars 125 and the first and second logic chips 20a and 20b through the first redistribution patterns 113 of the first redistribution layer 110. One of the first and second memory chips 10a and 10b may be a dummy chip that is not electrically connected to the metal pillars 125, the first logic chip 20a or the second logic chip 20b.

Figure 14:
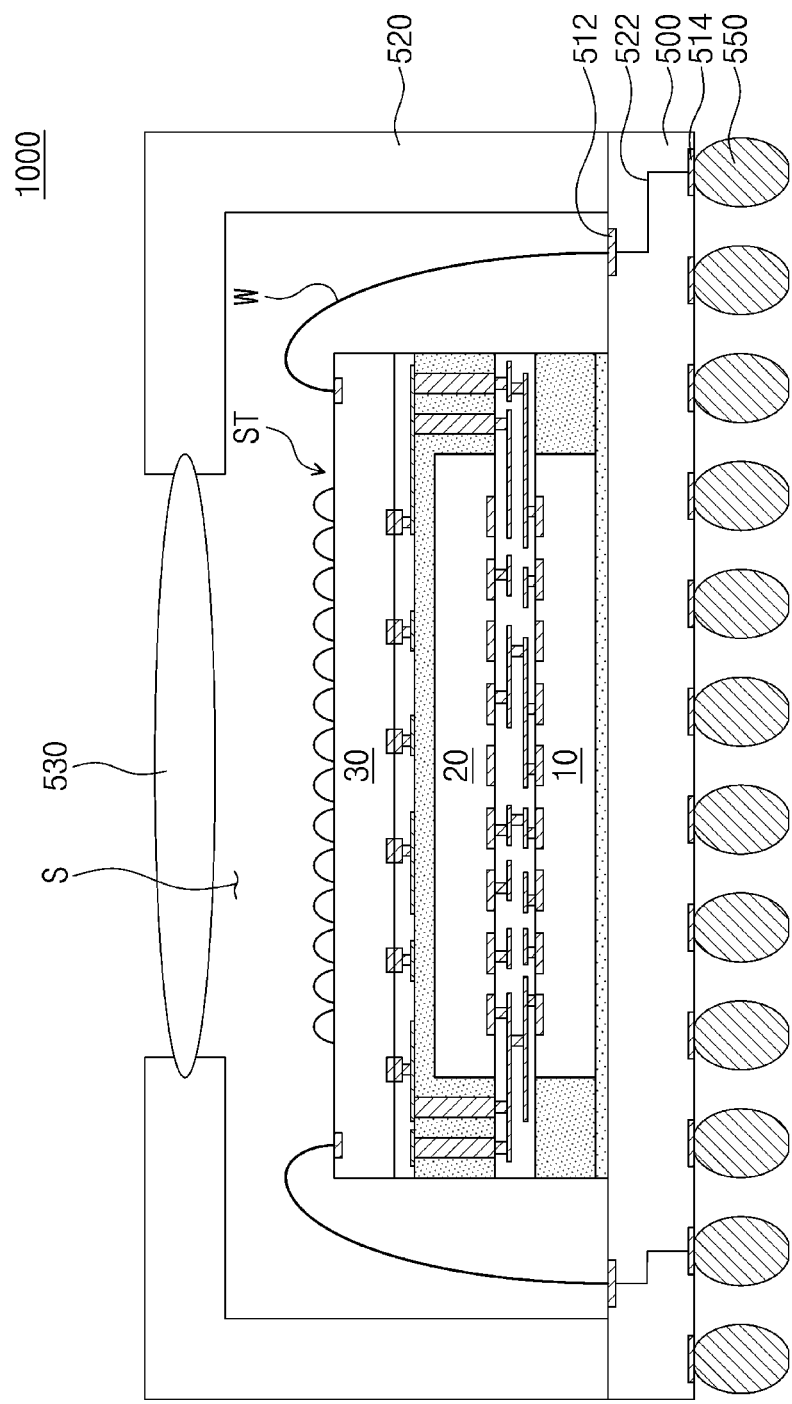
FIG. 14 is a cross-sectional view of an image sensor module according to the present inventive concepts.

FIG. 14 illustrates an example of an image sensor module according to the present inventive concepts, referred to hereinafter as an image sensor package 1000.

Referring to FIG. 14, the image sensor package 1000 may include a package substrate 500 and any one of the semiconductor packages ST shown in and described above with reference to FIGS. 9, 11, 12, and 13.

The semiconductor package ST may be attached through an adhesive to the package substrate 500. The package substrate 500 may be a printed circuit board, a flexible substrate, or a tape substrate. For example, the package substrate 500 may be a flexible printed circuit board, a rigid printed circuit board, or a combination thereof, each of which boards includes an insulating body of one or more layers and internal electrical lines formed therein.

The package substrate 500 may have top and bottom surfaces facing in opposite directions, and may include bonding pads 512, external connection pads 514, and internal electrical lines 522. The bonding pads 512 may be arranged on the top surface of the package substrate 500, and the external connection pads 514 may be arranged on the bottom surface of the package substrate 500. The bonding pads 512 may be electrically connected through the internal electrical lines 522 to the external connection pads 514. External connection terminals 550 may be attached to the external connection pads 514. The external connection terminals 550 may be arranged to constitute a ball grid array (BGA).

Bonding wires W may connect the bonding pads 512 of the package substrate 500 to upper conductive pads of the image sensor chip 30. The image sensor package 1000 may be electrically connected through the bonding wires W to the package substrate 500.

A holder 520 may be disposed on the package substrate 500. The holder 520 may be spaced apart from the semiconductor package ST. The holder 520 may be attached through an adhesive to the package substrate 500. The holder 520 may be circumjacent the semiconductor package ST and may have a hollow structure. The holder 520 may be formed of a polymeric material such as polyamide.

A transparent cover 530 may be supported by the transparent cover 530 as vertically spaced apart from the image sensor chip 30. The transparent cover 530 may be formed of transparent glass or plastic. The transparent cover 530 and the semiconductor package ST may be spaced apart from each with an empty space S left therebetween.

Figure 15:
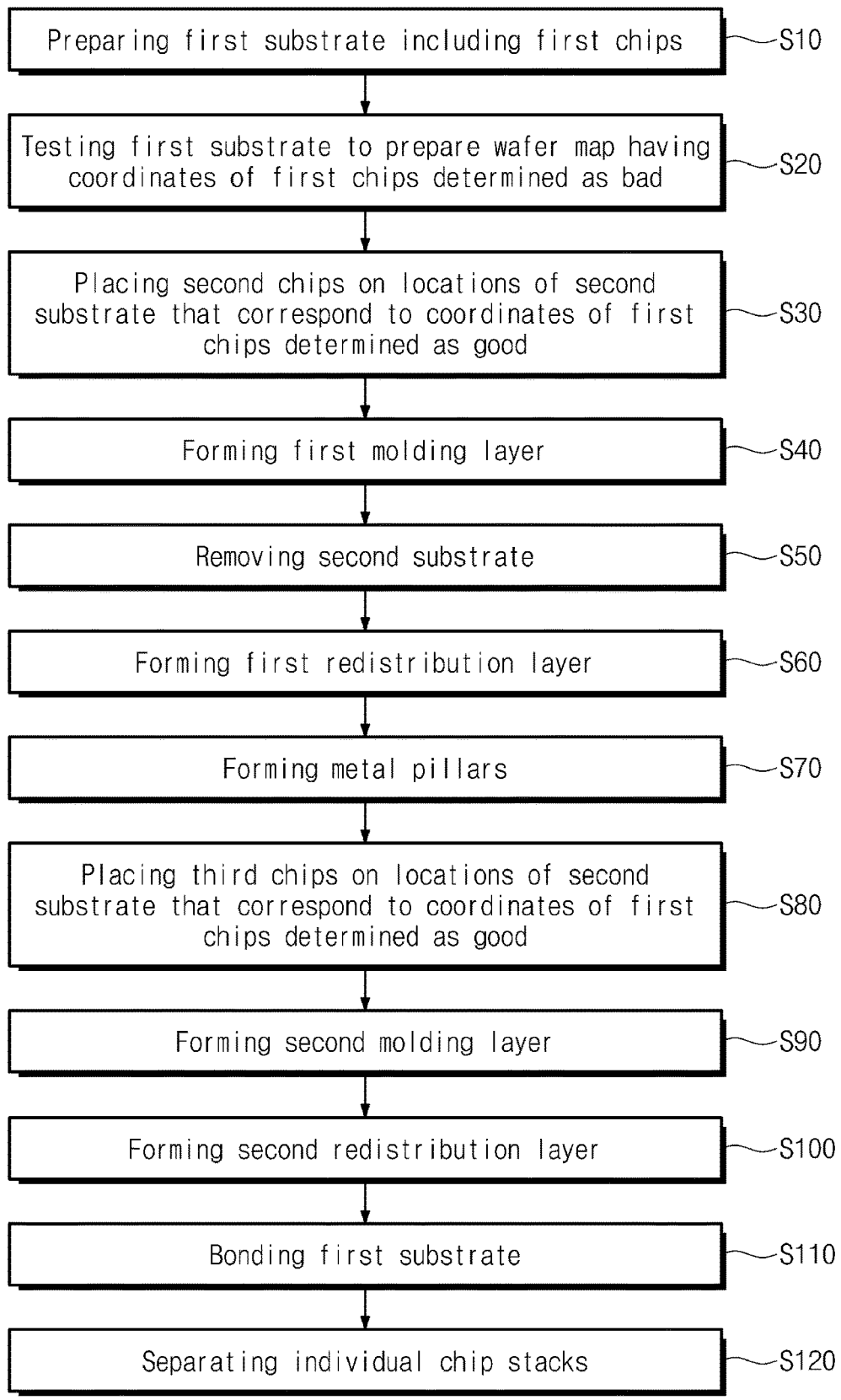
FIG. 15 is a flow chart of a method of manufacturing a semiconductor package according to the present inventive concepts.

The flow chart of FIG. 15 and the corresponding sectional views of FIGS. 16A to 16I illustrate an example of a method of manufacturing a semiconductor package according to the present inventive concepts.

Figure 16A:
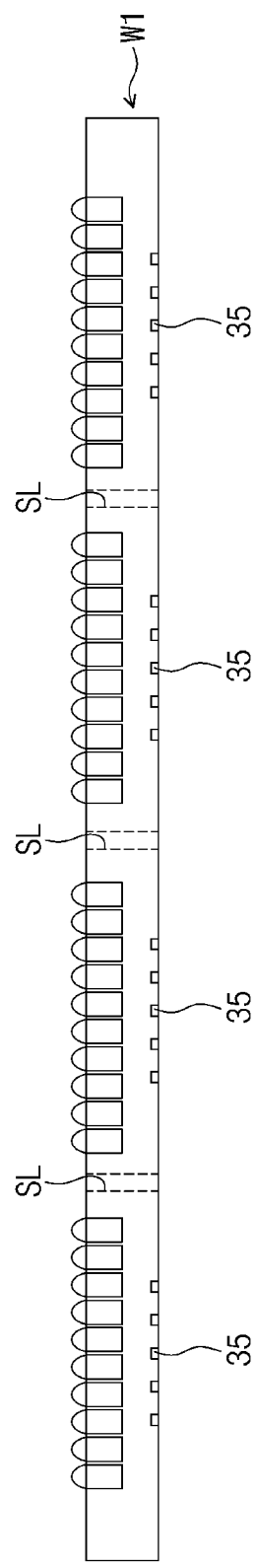

Referring to FIGS. 15 and 16A, a first substrate W1 may be prepared that includes a plurality of first semiconductor chips (S10). In certain examples, the first semiconductor chips are image sensor chips of the type described above with reference to FIG. 9. For example, the first substrate W1 includes image sensor chips arranged in rows and columns. As described above, the image sensor chips may each include a photoelectric conversion layer, a readout circuit layer, and a micro-lens array. The image sensor chips may each further include chip pads 35 on a bottom surface thereof.

After the first substrate W1 is prepared, each of the first semiconductor chips (or the image sensor chips) may undergo an electrical test to prepare a wafer map having information about coordinates of the first semiconductor chips (or the image sensor chips) determined as bad (S20).

Figure 16B:
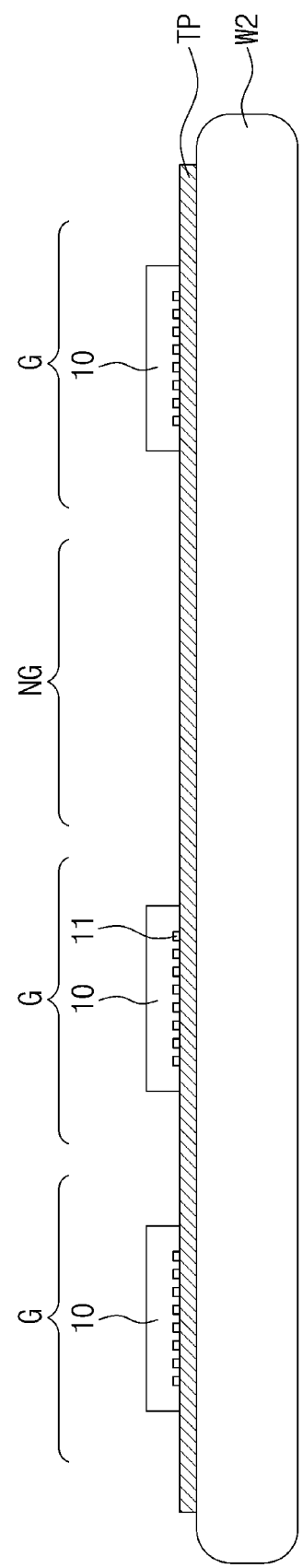

Referring to FIGS. 15 and 16B, the wafer map obtained from the test process on the first substrate W1 may be used to place second semiconductor chips on a second substrate W2 (S30).

In certain examples, the second semiconductor chips are memory chips or logic chips described above with reference to FIG. 9. The following will describe an example in which the second substrate W2 is provided thereon with memory chips 10 as the second semiconductor chips.

The memory chips 10 are disposed on locations of the second substrate W2 corresponding to coordinates of the image sensor chips determined as good. No memory chips 10 are disposed on locations that correspond to coordinates of the image sensor chips determined as bad, i.e., such locations may be left empty. In such cases, the second substrate W2 includes normal regions G provided with the memory chips 10 and abnormal regions NG provided with no memory chips 10, and at least one memory chip 10 is disposed on each of the normal regions G.

Each of the memory chips 10 may include chip pads 11 on a bottom surface thereof, and the memory chips 10 may be attached to the second substrate W such that the chip pads 11 face the second substrate W2.

Referring to FIGS. 15 and 16C, on the second substrate W2, a first molding layer 120 is formed to cover a plurality of the memory chips 10 (S40). The first molding layer 120 may fill gaps between the memory chips 10, and may cover top surfaces of the memory chips 10.

Referring to FIGS. 15 and 16D, the second substrate W2 is removed from the first molding layer 120 (S50). The removing of the second substrate W2 may expose the chip pads 11 of the memory chips 10.

A first redistribution layer 110 is formed on a bottom surface of the first molding layer 120 and the bottom surfaces of the memory chips 10 (S60).

The forming of the first redistribution layer 110 may include forming first dielectric layers 111 and forming first redistribution patterns 113. The first redistribution patterns 113 may be formed both on the normal regions G and on the abnormal regions NG.

The first redistribution patterns 113 may be connected to the chip pads 11 of the memory chip 10 on each of the normal regions G, and may be regarded as dummy patterns on each of the abnormal regions NG.

Referring to FIGS. 15 and 16E, metal pillars 125 are formed on the first redistribution layer 110 (S70).

The forming of the metal pillars 125 may include forming on the first redistribution layer 110 a mask pattern having openings that partially expose the first redistribution patterns 113, and then performing an electroplating process to fill the openings with a conductive material. The metal pillars 125 may be formed both on the normal regions G and on the abnormal regions NG.

In certain examples, the metal pillars 125 are formed on an edge of each of the normal regions G and on an edge of each of the abnormal regions NG. For example, when viewed in plan, the metal pillars 125 may be formed around each of the memory chips 10.

Referring to FIGS. 15 and 16F, the wafer map obtained from the first substrate W1 may be used to provide third semiconductor chips on the first redistribution layer 110 (S80).

In certain examples, the third semiconductor chips are memory chips or logic chips described above with reference to FIG. 9. The following will describe an example in which the second substrate W2 is provided thereon with logic chips 20 as the third semiconductor chips.

Each of the logic chips 20 may include chip pads 21 on a bottom surface thereof, and the chip pads 21 may be disposed to face the first redistribution layer 110. The chip pads 21 of the logic chips 20 may be electrically connected to the first redistribution patterns 113 of the first redistribution layer 110. The logic chips 20 may have their top surfaces lower than those of the metal pillars 125.

Figure 16G:
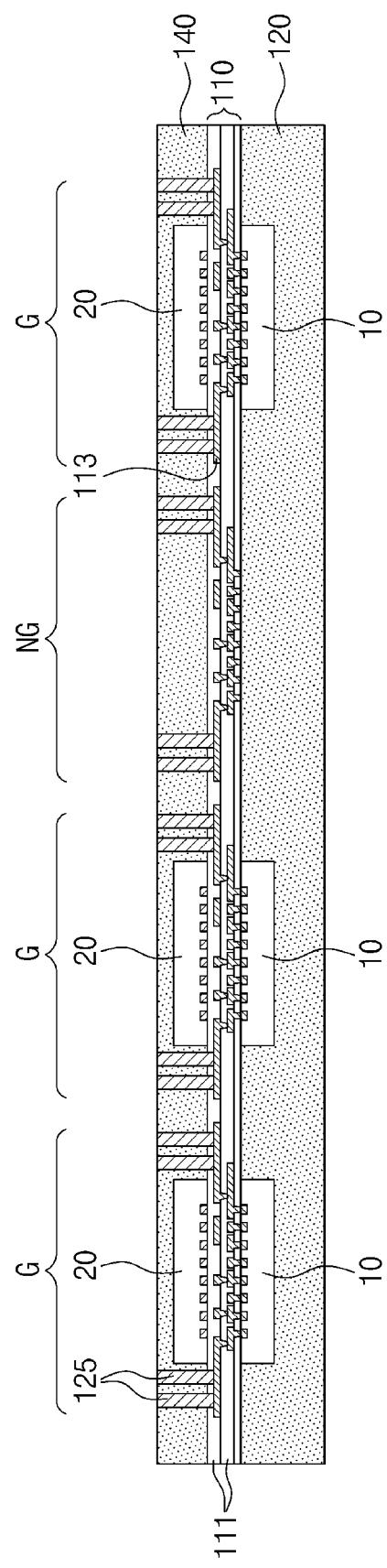

Referring to FIGS. 15 and 16G, a second molding layer 140 may be formed on the first redistribution layer 110 to cover the logic chips 20 (S90).

The second molding layer 140 may be formed thick enough to cover the metal pillars 125 and the logic chips 20, and then may undergo a grinding process to expose the top surfaces of the metal pillars 125.

Figure 16H:
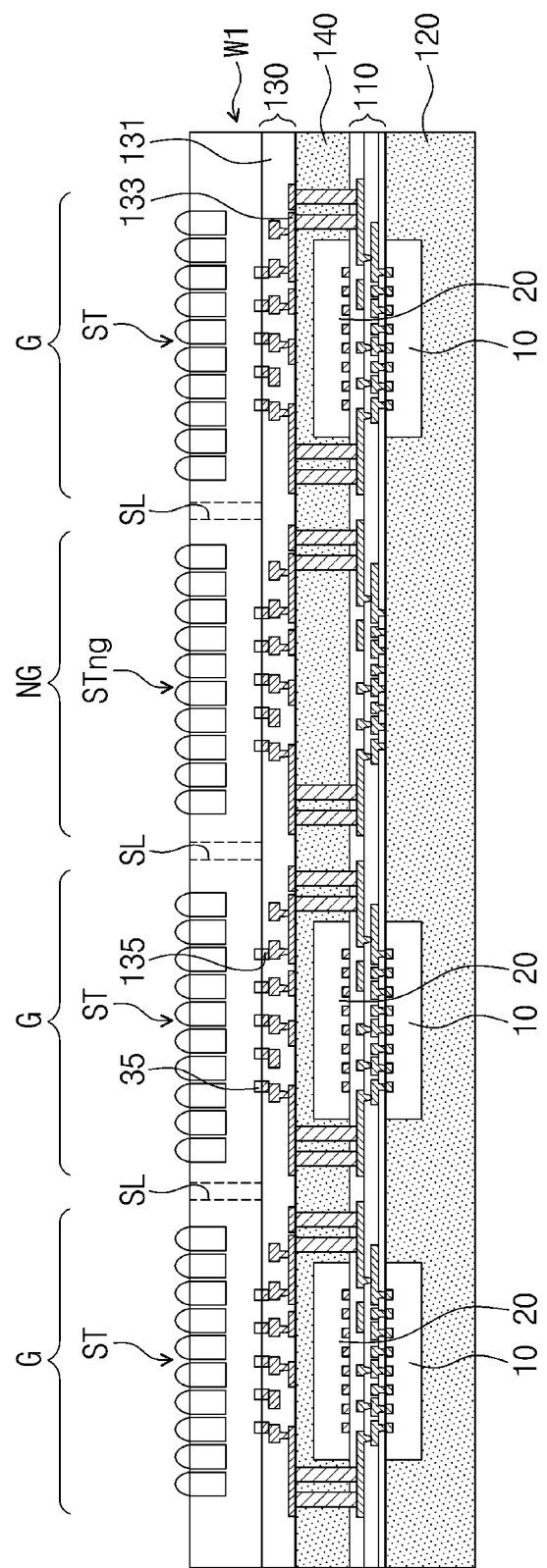

Referring to FIGS. 15 and 16H, a second redistribution layer 130 may be formed on the second molding layer 140 (S100).

The second redistribution layer 130 may include second dielectric layers 131 and second redistribution patterns 133. The second redistribution patterns 133 of the second redistribution layer 130 may be electrically connected to the metal pillars 125 and may extend over the logic chips 20. Second connection pads 135 may be formed in an uppermost second dielectric layer 131, and top surfaces of the second connection pads 135 may be exposed.

Referring again to FIGS. 15 and 16H, the second redistribution layer 130 may be bonded to the first substrate W1 including the image sensor chips thereon (S110).

The first substrate W1, as described above with reference to FIG. 16A, may include the bad image sensor chips. Because the memory and logic chips 10 and 20 are disposed using the wafer map obtained from the first substrate W1, neither memory chips 10 nor logic chips 20 are present below the bad image sensor chips when the first substrate W1 is bonded to the second redistribution layer 130.

The bonding of the first substrate W1 may include placing the chip pads 35 of the image sensor chips in contact with the second connection pads 135 of the second redistribution layer 130, and then performing a thermocompression process. Therefore, the chip pads 35 of the image sensor chips may be coupled to the second connection pads 135 of the second redistribution layer 130. The thermocompression process may cause each connection pad 35 of the image sensor chip and the corresponding second connection pad 135 of the second redistribution layer 130 to form a single body.

Referring to FIGS. 15 and 16I, the first substrate W1 may be cut along scribe lane regions SL to separate chip stacks ST, or semiconductor packages, from each other (S120).

The separated chip stacks ST may include a bad chip stack STng consisting of the image sensor chips determined as bad. The bad chip stack STng does not include a logic chip 20 or a memory chip 10, and thus none of the logic and memory chips 20 and 10 determined as good are wasted.

FIGS. 17A to 17G illustrate another example of a method of manufacturing a semiconductor package according to the present inventive concepts.

For brevity, features of this example of the method similar to those described above with reference to FIGS. 16A to 16I, and components allocated by the same reference numerals, will not be described again in detail. Mainly only differences between this example and that of FIGS. 16A-16I will be described.

Figure 17A:
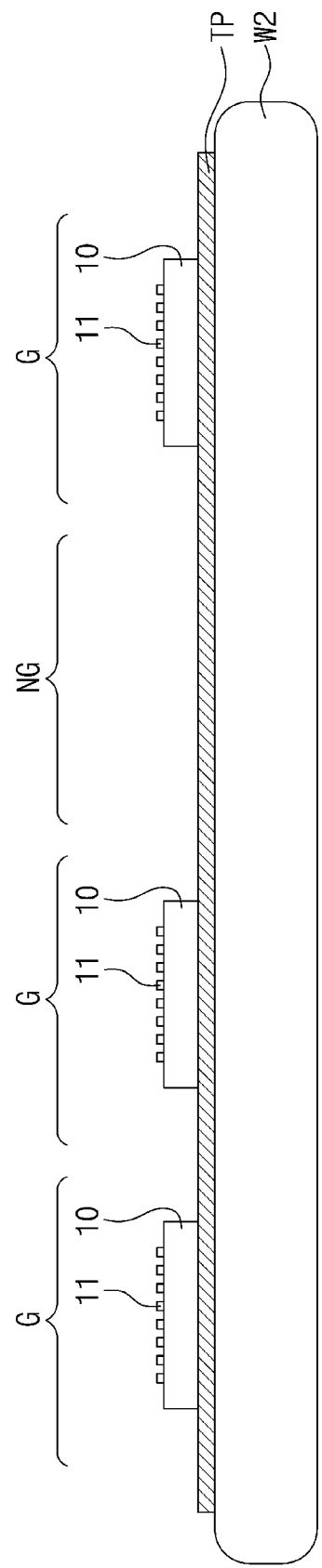

Referring to FIG. 17A, the second substrate W2 includes the normal regions G and abnormal regions NG, which abnormal regions NG correspond to locations on which are disposed the image sensor chips determined as bad on the first substrate W1.

The memory chips 10 may be attached to corresponding normal regions G of the second substrate W2. The chip pads 11 may be provided on the bottom surface of each of the memory chips 10, and the top surfaces of the memory chips 10 may be attached to the second substrate W2.

The chip pads 11 of the memory chips 10 are electrically connected to integrated circuits of the memory chips 10. The chip pads 11 may protrude beyond top surfaces of dielectric layers of the memory chips 10.

Figure 17B:
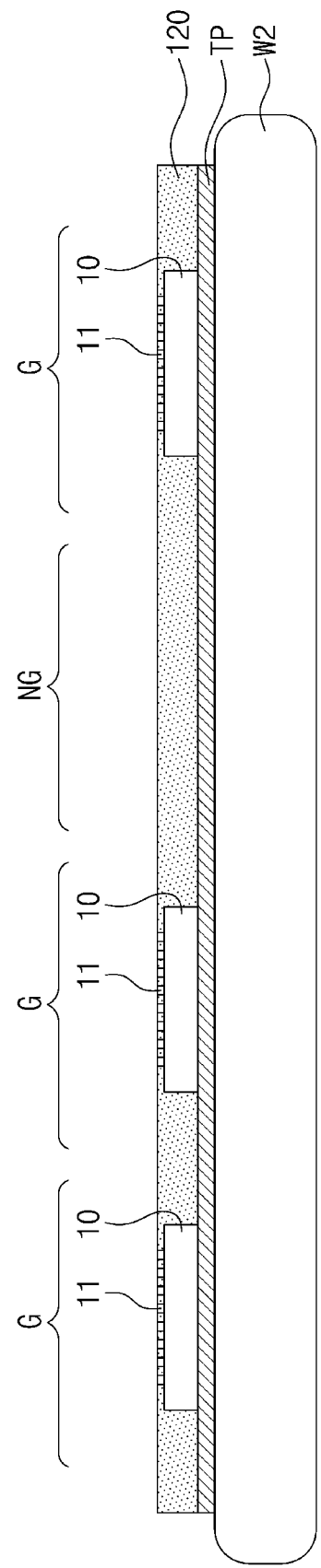

Referring to FIG. 17B, the first molding layer 120 may be formed thick enough to cover the memory chips 10 on the second substrate W2, and may then undergo a grinding process to expose the top surfaces of the chip pads 11.

Figure 17C:
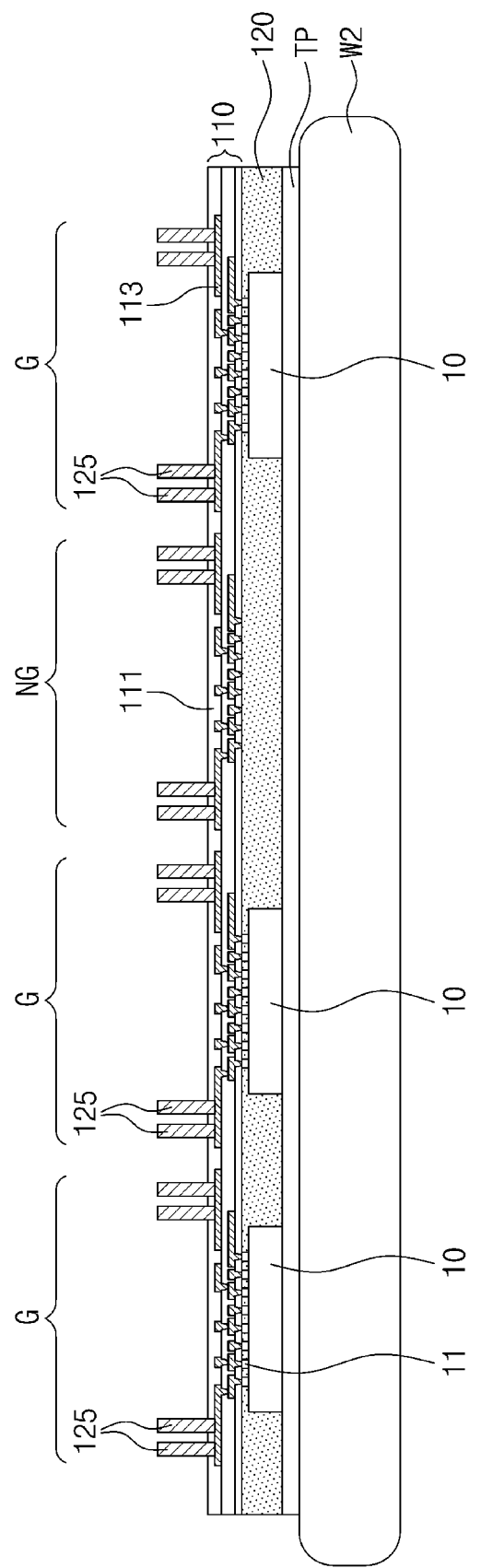

Referring to FIG. 17C, the first redistribution layer 110 may be formed on the first molding layer 120. The first redistribution layer 110, as described above, may include the first dielectric layers 111 and the first redistribution patterns 113. On each of the normal regions G, the first redistribution patterns 113 may be electrically connected to the chip pads 11 of the memory chip 10.

The metal pillars 125 may be formed on the first redistribution layer 110. The metal pillars 125, as described above with reference to FIG. 16E, may be connected to select ones of the first redistribution patterns 113.

Figure 17D:
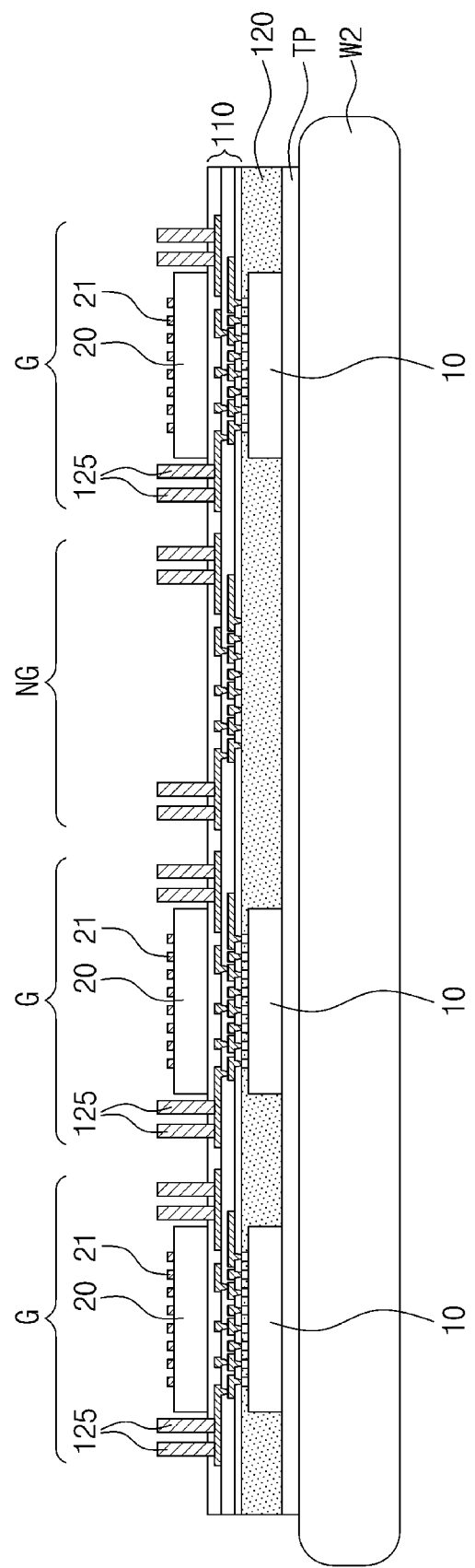

Referring to FIG. 17D, after the metal pillars 125 are formed, the logic chips 20 may be placed on the first redistribution layer 110. The wafer map obtained from the first substrate W1 may be used to place the logic chips 20 on the first redistribution layer 110.

Each of the logic chips 20 may include the chip pads 21 on the bottom surface thereof, and the logic chips 20 may be oriented with their top surfaces facing the first redistribution layer 110. The chip pads 21 of the logic chips 20 may be located at a lower level than that of the top surfaces of the metal pillars 125.

Figure 17E:
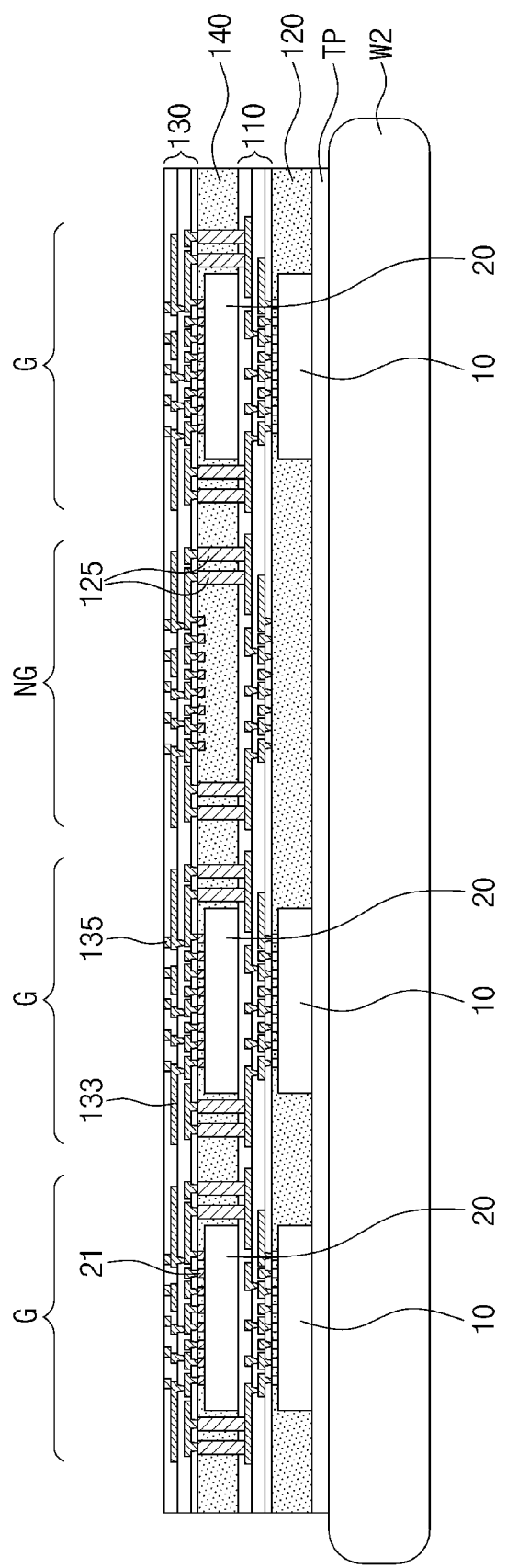

Referring to FIG. 17E, the second molding layer 140 may be formed on the first redistribution layer 110 to cover the logic chips 20. The second molding layer 140 may be formed thick enough to cover the logic chips 20 and the metal pillars 125, and may then undergo a grinding process to expose the top surfaces of the metal pillars 125 and to reveal the chip pads 21 of the logic chips 20.

The second redistribution layer 130 may be formed on the second molding layer 140. The second redistribution layer 130 may include the second redistribution patterns 133 that are connected to the metal pillars 125 and to the chip pads 21 of the logic chips 20. As described above, the second redistribution layer 130 may include the second connection pads 135.

Referring again to FIG. 17F, the second redistribution layer 130 may be bonded thereto with the first substrate W1 including the image sensor chips. Therefore, the chip pads 35 of the image sensor chips may be coupled to the second connection pads 135 of the second redistribution layer 130.

Figure 17G:
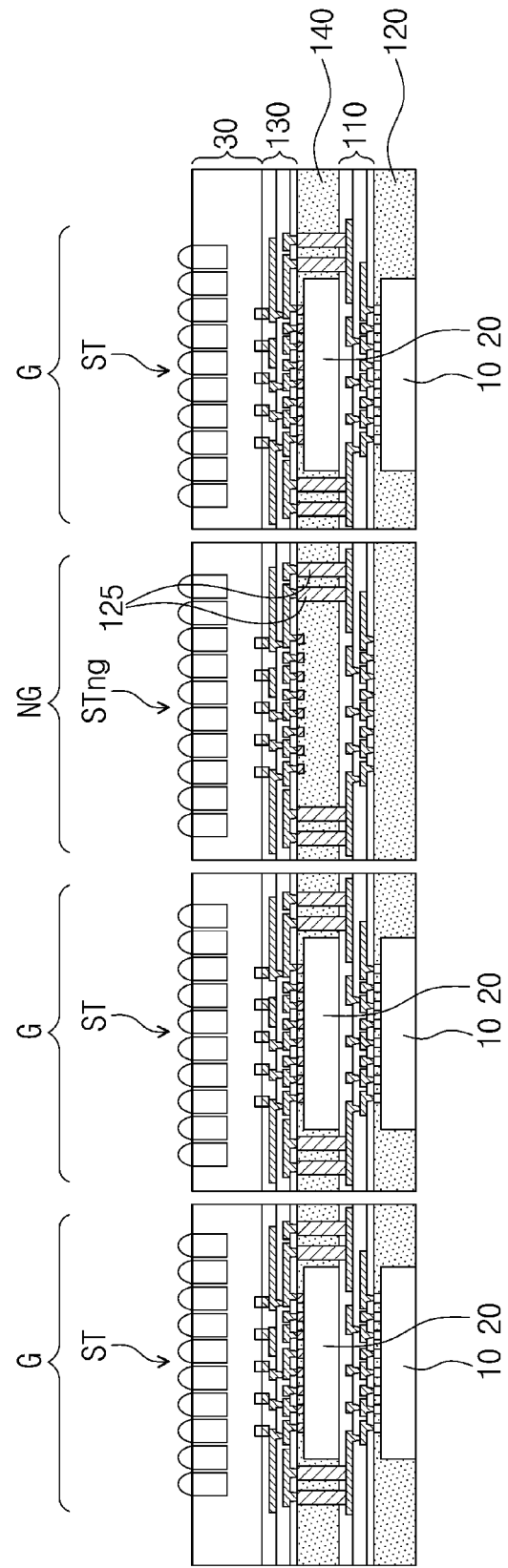

Referring to FIG. 17G, the first and second substrates W1 and W2 combined with each other may be cut to separate the chip stacks ST from each other. Alternatively, after the second substrate W2 is removed, and first substrate W1 may be cut to separate the chip stacks ST from each other.

Figure 18A:
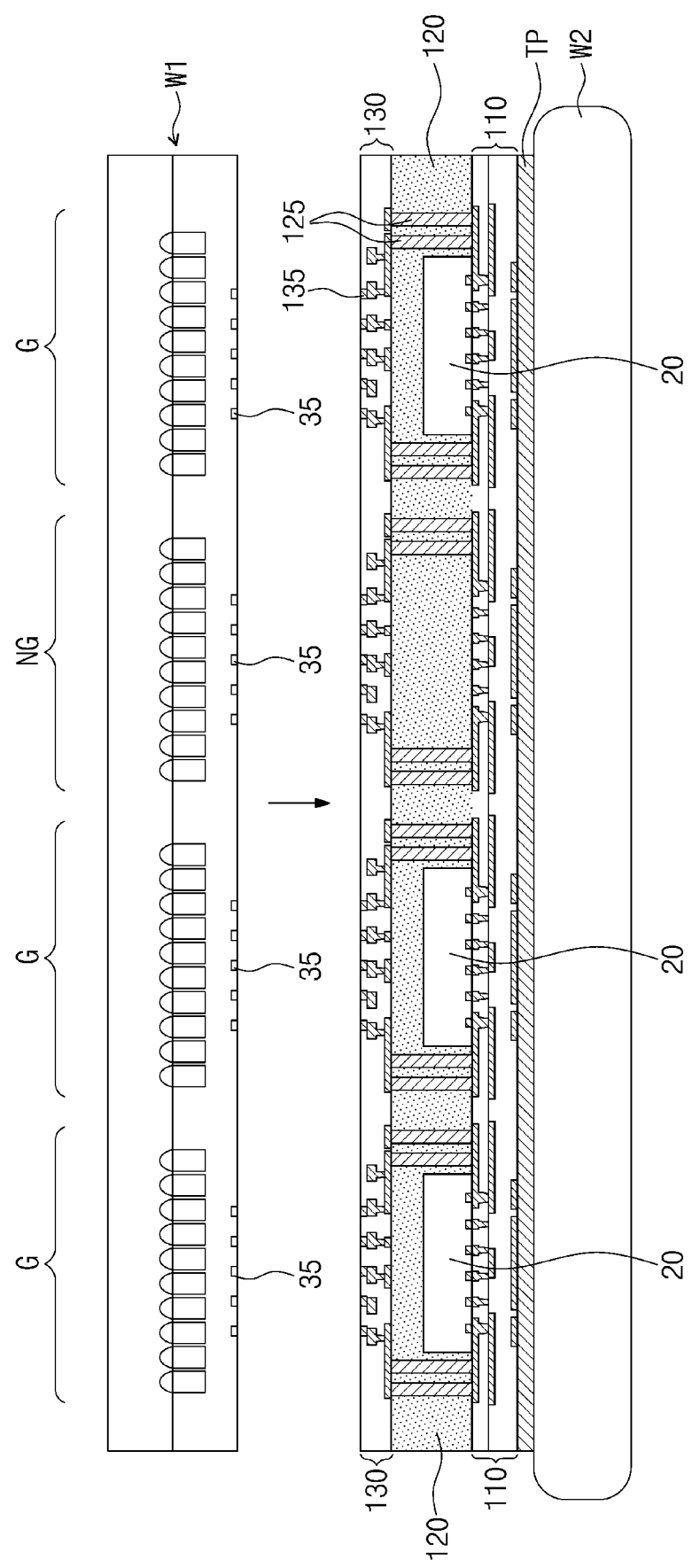
FIGS. 18A and 18B are cross-sectional views of wafer structures during the course of a manufacturing process and illustrate another example of a wafer-level method of manufacturing a semiconductor package according to the present inventive concepts.
Figure 18B:
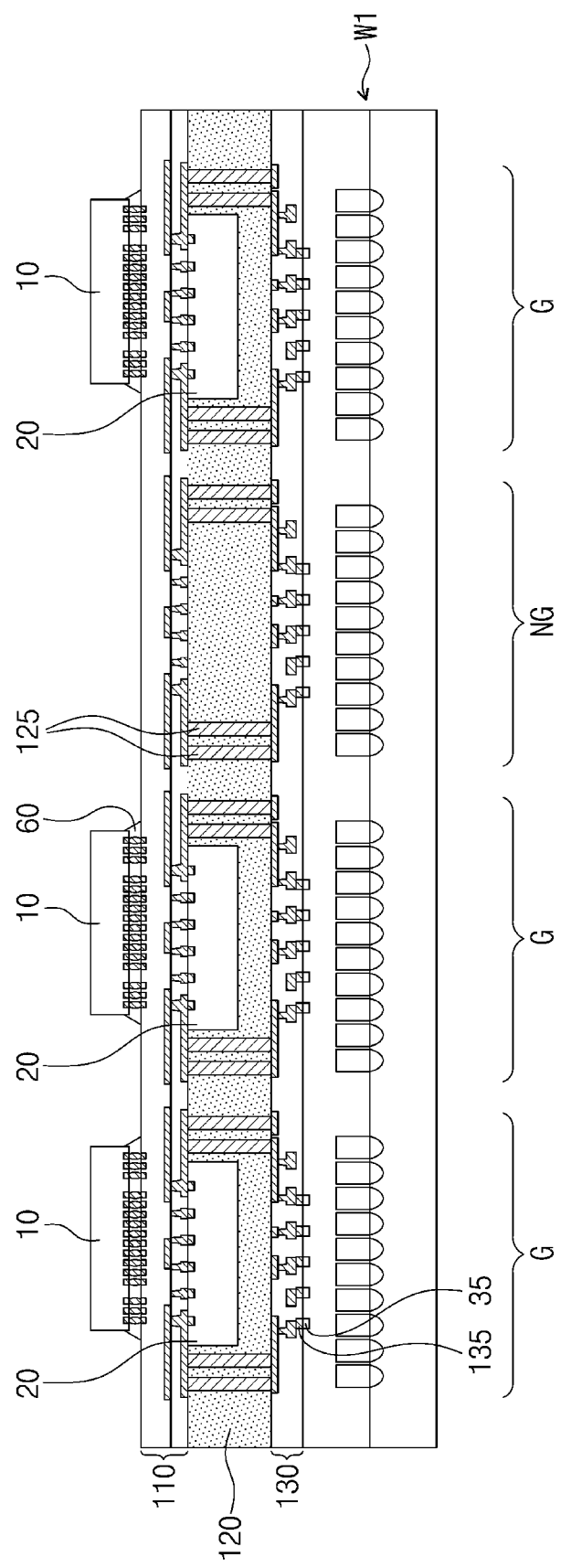

FIGS. 18A and 18B illustrate stages in another example of a method of manufacturing a semiconductor package according to the present inventive concepts.

As was the case with the example of FIGS. 17A-17G, for brevity, features of this example of the method similar to those described above with reference to FIGS. 16A to 16I, and components allocated by the same reference numerals, will not be described again in detail. Mainly only differences between this example and that of FIGS. 16A-16I will be described.

Referring to FIG. 18A, the logic chips 20 may be disposed on corresponding normal regions G of the second substrate W2, and then the first redistribution layer 110 may be formed on the bottom surfaces of the logic chips 20. The first molding layer 120 may be formed to cover the logic chips 20 on the first redistribution layer 110, and the second redistribution layer 130 may be formed on the first molding layer 120. Before the first molding layer 120 is formed, the metal pillars 125 may be formed to connect the first and second redistribution layers 110 and 130 to each other.

After the second redistribution layer 130 is formed, the second redistribution layer 130 may be bonded to the first substrate W1 including the image sensor chips. Therefore, the chip pads 35 of the image sensor chips may be coupled to the second connection pads 135 of the second redistribution layer 130.

Referring to FIG. 18B, after the second substrate W2 is removed, the memory chips 10 may be mounted on the first redistribution layer 110 on the normal regions G. Connection terminals may be interposed between the first redistribution layer 110 and each of the memory chips 10. Also, the under-fill layer 60 may be formed on each of the normal regions G to fill gaps between the connection terminals.

After the under-fill layer 60 is formed, as described above, the first substrate W1 may be cut to separate the chip stacks from each other.

According to some example examples of the present inventive concepts, a semiconductor package (which may be referred to as a chip stack as in the description of the methods above) may be configured such that an upper chip is connected to a lower chip through metal pillars provided around the lower chip. Thus, the lower chip does not require conductive connection structures to electrically connect the lower and upper chips to each other. Accordingly, a semiconductor package (or a chip stack) according to the present inventive concepts may have a high degree of electrical reliability.

In addition, the manufacturing of semiconductor packages (or chip stacks) in accordance with the present inventive concepts may benefit from the high yield associated with the lower chips.

For example, when second semiconductor chips are disposed on a second substrate in a method of manufacturing a semiconductor package according to the present inventive concepts, no second semiconductor chips are placed on locations that correspond to those of first semiconductor chips determined as bad chips. Thus, when the first and second substrates are combined, second semiconductor chips known to be good are not wasted as they otherwise would be if they were operatively associated with the first semiconductor chips determined as bad chips. Therefore, a method of manufacturing a semiconductor package according to the present inventive concepts provides a high manufacturing yield.

Finally, although the present inventive concepts have been described above in connection with various examples thereof, it will be understood to those skilled in the art that various changes and modifications may be made to such examples without departing from the technical spirit and scope of the present inventive concepts as defined by the appended claims.

What is claimed is:

1. A semiconductor package, comprising:
a first redistribution layer;
a first semiconductor chip on the first redistribution layer;
a molding layer on the first redistribution layer and covering the first semiconductor chip;

a plurality of metal pillars around the first semiconductor chip and connected to the first redistribution layer, the metal pillars extending axially through the molding layer;

a second redistribution layer on the molding layer and connected to the metal pillars;

a second semiconductor chip on the second redistribution layer;

a third semiconductor chip on a side of the first redistribution layer opposite that on which the first semiconductor chip is disposed such that the first redistribution layer is interposed between the first semiconductor chip and the third semiconductor chip; and a lower molding layer on the first redistribution layer and covering the third semiconductor chip, wherein, when viewed in plan, the second semiconductor chip overlaps the first semiconductor chip and the metal pillars.

2. The semiconductor package of claim 1, wherein the second redistribution layer comprises a plurality of connection pads connected to the metal pillars, and the second semiconductor chip comprises a plurality of chip pads coupled to the connection pads.

3. The semiconductor package of claim 1, wherein the second semiconductor chip comprises an interlayer dielectric and a plurality of chip pads in the interlayer dielectric, the interlayer dielectric and the plurality of chip pads facing the second redistribution layer.

4. The semiconductor package of claim 1, wherein a lateral surface of the second semiconductor chip is coplanar with a lateral surface of the molding layer.

5. The semiconductor package of claim 1, wherein each of the metal pillars has a length greater than a thickness of the first semiconductor chip.

6. The semiconductor package of claim 1, wherein the first semiconductor chip comprises a plurality of chip pads at a bottom surface of the first semiconductor chip, the first redistribution layer has internal first redistribution patterns, and the chip pads are connected to the metal pillars by a plurality of the internal first redistribution patterns of the first redistribution layer.

7. The semiconductor package of claim 1, wherein the first semiconductor chip comprises a plurality of chip pads at a top surface of the first semiconductor chip, the second redistribution layer has internal second redistribution patterns, and the chip pads are connected to the metal pillars by a plurality of the internal second redistribution patterns of the second redistribution layer.

8. The semiconductor package of claim 7, wherein the first semiconductor chip has a chip body and the chip pads are disposed on a top surface of the chip body as spaced from each other to define gaps therebetween, and the molding layer fills the gaps between the chip pads.

9. The semiconductor package of claim 1, wherein the first semiconductor chip is a memory chip, the second semiconductor chip is a logic chip, and the third semiconductor chip is an image sensor chip.

10. The semiconductor package of claim 1, wherein a lateral surface of the lower molding layer is coplanar with a lateral surface of the second semiconductor chip.

11. The semiconductor package of claim 1, wherein the third semiconductor chip has a plurality of chip pads, and the semiconductor package further comprises:

a plurality of connection terminals between the first redistribution layer and the plurality of chip pads of the third semiconductor chip, the connection terminals being spaced from each other such that gaps are defined therebetween; and an under-fill layer filling the gaps between the connection terminals.

12. A semiconductor package, comprising:

a first redistribution layer having opposite upper and lower sides, the first redistribution layer comprising a first body of dielectric material and redistribution wiring including a layer of electrically conductive patterns within the first body of dielectric material;

a first semiconductor chip disposed on the lower side of the first redistribution layer and electrically connected to the redistribution wiring of the first redistribution layer;

a second semiconductor chip disposed on the upper side of the first redistribution layer and electrically connected to the redistribution wiring of the first redistribution layer;

a molding layer on the upper side of the first redistribution layer and encapsulating the second semiconductor chip on the first redistribution layer;

electrically conductive pillars each extending axially through the molding layer laterally of the second semiconductor chip and electrically connected to the redistribution wiring of the first redistribution layer;

a second redistribution layer on the molding layer, the second redistribution layer comprising a second body of dielectric material and redistribution wiring including a layer of electrically conductive patterns within the second body of dielectric material, the redistribution wiring of the second redistribution layer being electrically connected to the pillars; and a third semiconductor chip on the second redistribution layer, the third semiconductor chip having chip pads facing the second redistribution layer and electrically connected to the redistribution wiring of the second redistribution layer, wherein, when viewed in plan, the third semiconductor chip overlaps the second semiconductor chip and the pillars, and wherein the first semiconductor chip is a memory chip, the second semiconductor chip is a logic chip, the third semiconductor chip is an image sensor chip including a layer of pixels and a readout circuit layer between the layer of pixels and the second redistribution layer, and the redistribution wiring of the second redistribution layer electrically connects the image sensor chip at the readout circuit layer thereof to the pillars.

13. The semiconductor package of claim 12, wherein a lateral surface of the second semiconductor chip is coplanar with lateral surface of the molding layer.

14. The semiconductor package of claim 12, wherein the molding layer extends between an upper surface of the second semiconductor chip and the second redistribution layer and covers lateral surfaces of the second semiconductor chip.

15. The semiconductor package of claim 14, wherein the second semiconductor chip has electrically conductive chip pads disposed on said upper surface as facing the second redistribution layer, the chip pads are spaced apart from each other so as to define gaps therebetween and the molding layer fills the gaps, and the redistribution wiring of the second redistribution layer electrically connects the chip pads to the pillars.

16. The semiconductor package of claim 14, wherein the second semiconductor chip has electrically conductive chip pads at a lower surface thereof facing the first redistribution layer, and the redistribution wiring of the first redistribution layer electrically connects the chip pads to the pillars.

17. A semiconductor package, comprising:
a first layer including a first semiconductor chip;
a second layer stacked on the first layer and including a second semiconductor chip, a molding layer encapsulating the second semiconductor chip;
a third layer stacked on the second layer and including a third semiconductor chip;
a first redistribution layer interposed between the first layer and the second layer, the first redistribution layer comprising a first body of dielectric material and redistribution wiring including a layer of electrically conductive patterns within the first body of dielectric material;
a second redistribution layer interposed between the second layer and the third layer, the second redistribution layer comprising a second body of dielectric material and redistribution wiring including a layer of electrically conductive patterns within the second body of dielectric material; and
electrically conductive pillars extending axially through the molding layer laterally of the second semiconductor chip,
wherein when viewed in plan, the third semiconductor chip overlaps the second semiconductor chip and the pillars,
the molding layer is sandwiched between the first body of dielectric material and the second body of dielectric material,
the redistribution wiring of the second redistribution layer electrically connects the third semiconductor chip to the pillars,
the redistribution wiring of the first redistribution layer electrically connects to first semiconductor chip to the pillars, and
the redistribution wiring of one of the first and second redistribution layers electrically connects the second semiconductor chip to the pillars.

18. The semiconductor package of claim 17, wherein the first semiconductor chip is a memory chip, the second semiconductor chip is a logic chip, the third semiconductor chip is an image sensor chip including a layer of pixels and a readout circuit layer between the layer of pixels and the second redistribution layer, and the redistribution wiring of the second redistribution layer electrically connects the image sensor chip at the readout circuit layer thereof to the pillars.

19. The semiconductor package of claim 17, wherein the molding layer extends between an upper surface of the second semiconductor chip and the second redistribution layer and covers lateral surfaces of the second semiconductor chip,
the second semiconductor chip has electrically conductive chip pads disposed on said upper surface as facing the second redistribution layer,
the chip pads are spaced apart from each other so as to define gaps therebetween and the molding layer fills the gaps, and
the redistribution wiring of the second redistribution layer electrically connects the chip pads to the pillars.

20. The semiconductor package of claim 17, wherein the molding layer extends between an upper surface of the second semiconductor chip and the second redistribution layer and covers lateral surfaces of the second semiconductor chip,
the second semiconductor chip has electrically conductive chip pads at a lower surface thereof facing the first redistribution layer, and
the redistribution wiring of the first redistribution layer electrically connects the chip pads to the pillars.

* * * * *